(12) United States Patent
Shigeta

(10) Patent No.: US 10,965,890 B2
(45) Date of Patent: Mar. 30, 2021

(54) IMAGING DEVICE AND IMAGING SYSTEM

(71) Applicant: CANON KABUSHIKI KAISHA, Tokyo (JP)

(72) Inventor: Kazuyuki Shigeta, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 6 days.

(21) Appl. No.: 16/409,622

(22) Filed: May 10, 2019

(65) Prior Publication Data

US 2019/0356870 A1 Nov. 21, 2019

(30) Foreign Application Priority Data

May 17, 2018 (JP) .............................. JP2018-095043

(51) Int. Cl.
*H04N 5/341* (2011.01)
*H04N 5/355* (2011.01)
*H04N 5/3745* (2011.01)
*H01L 27/146* (2006.01)

(52) U.S. Cl.
CPC ....... *H04N 5/341* (2013.01); *H01L 27/14603* (2013.01); *H04N 5/3559* (2013.01); *H04N 5/37455* (2013.01)

(58) Field of Classification Search
CPC ............. H04N 5/35581; H04N 5/2357; H04N 5/35554; H04N 5/37452; H04N 5/2355
See application file for complete search history.

(56) References Cited

U.S. PATENT DOCUMENTS

| | | |
|---|---|---|
| 6,157,409 A | 12/2000 | Riches |
| 7,859,575 B2 | 12/2010 | Ota |
| 8,189,086 B2 | 5/2012 | Hashimoto |
| 8,310,576 B2 | 11/2012 | Hashimoto |
| 8,390,710 B2 | 3/2013 | Shigeta |
| 8,553,119 B2 | 10/2013 | Hashimoto |
| 8,624,992 B2 | 1/2014 | Ota |
| 8,836,832 B2 | 9/2014 | Shigeta |
| 8,928,789 B2 | 1/2015 | Hashimoto |

(Continued)

FOREIGN PATENT DOCUMENTS

| | | |
|---|---|---|
| JP | 8-172584 | 7/1996 |
| JP | 2001-103378 | 4/2001 |

(Continued)

*Primary Examiner* — Antoinette T Spinks
(74) *Attorney, Agent, or Firm* — Venable LLP

(57) ABSTRACT

An imaging device includes pixels each including a photoelectric conversion unit and a charge holding unit and a control unit that performs first control, which causes the pixels to perform an operation that includes an exposure operation of the photoelectric conversion unit, a reset operation of the charge holding unit, and a charge transfer operation from the photoelectric conversion unit to the charge holding unit and updates charges held by the charge holding unit by the reset and charge transfer operations, and second control to read out a signal based on charges held by the charge holding unit from each of the pixels. The control unit repeats the first control at a predetermined cycle without inserting the second control in a first period before a trigger signal is externally input and changes the first control to the second control when the trigger signal is externally input after the first period.

18 Claims, 14 Drawing Sheets

(56) References Cited

U.S. PATENT DOCUMENTS

| | | | |
|---|---|---|---|
| 9,049,389 B2 | 6/2015 | Hashimoto | |
| 9,191,600 B2 | 11/2015 | Hashimoto | |
| 9,282,271 B2 | 3/2016 | Hashimoto | |
| 9,300,889 B2 | 3/2016 | Hashimoto | |
| 9,413,964 B2 | 8/2016 | Kawano | |
| 9,912,886 B2 | 3/2018 | Shigeta | |
| 10,244,192 B2 | 3/2019 | Shigeta | |
| 2009/0251582 A1* | 10/2009 | Oike | H04N 3/155 348/308 |
| 2010/0157083 A1 | 6/2010 | Ohya | |
| 2010/0321532 A1 | 12/2010 | Hashimoto | |
| 2013/0044247 A1* | 2/2013 | Kawahito | H04N 5/37452 348/296 |
| 2015/0163421 A1 | 6/2015 | Shigeta | |
| 2016/0381308 A1* | 12/2016 | Raynor | H04N 5/2256 348/296 |
| 2017/0256580 A1 | 9/2017 | Sakaguchi | |
| 2017/0359535 A1* | 12/2017 | Kobayashi | H04N 5/3597 |
| 2018/0175103 A1* | 6/2018 | Ryoki | H01L 27/14643 |
| 2019/0305018 A1* | 10/2019 | Price | H04N 5/3535 |
| 2020/0014859 A1* | 1/2020 | Masuda | H04N 5/37452 |
| 2020/0029034 A1* | 1/2020 | Irie | H04N 5/23245 |

FOREIGN PATENT DOCUMENTS

| | | |
|---|---|---|
| JP | 2014-158089 | 8/2014 |
| JP | 2017-158178 | 9/2017 |

\* cited by examiner

IMAGING DEVICE AND IMAGING SYSTEM

BACKGROUND OF THE INVENTION

Field of the Invention

The present invention relates to an imaging device and an imaging system.

Description of the Related Art

In recent years, a function of capturing a moving image is mounted also on a digital camera which is mainly used for capturing a still image, and an imaging system capable of recording moving images of HD resolution (1920×1080 pixels) and the number of pixels such as 4K2K (3840×2160 pixels) has been popular. On the other hand, in imaging devices (CCD or CMOS area sensor or the like) used in such imaging systems, the output rate of image data is dramatically improved as the number of pixels increases. For example, imaging devices capable of capturing more than 10,000 frames per second have been developed for expensive high-speed cameras capable of recording a view of discharge, an impact of a bullet, or the like. Further, as a popular model, cameras on which an imaging device capable of capturing 300 to 1000 frames per second to realize slow-motion capturing of golf swing or the like is mounted have been commercialized.

When high-speed capturing at high frame rate is performed, however, there is a problem of difficulty in capturing an event at an occurrence timing which is actually necessary. That is, in high-speed capturing, it is important to continuously capture an event of an object having a high relative moving speed to the imaging devices while suppressing blurring and shaking of the image, and capturing of each one frame is performed at a relative moving speed of an object in short exposure time causing no blurring or shaking. Therefore, each frame of the consecutive frames includes a captured intermittent event, and between the frames, there is a time period in which no recording is performed. Accordingly, continuous capturing is performed only for a necessary period in accordance with the occurrence timing of a desired event designated by a trigger signal input from the outside, but the capturing may be missed for an event that occurs suddenly.

Japanese Patent Application Laid-Open No. H08-172584 discloses an imaging device that can extract a captured image before and after a trigger signal occurs by cyclically storing the captured image in a plurality of memories and stopping storage in response to input of the trigger signal. Further, Japanese Patent Application Laid-Open No. 2014-158089 discloses an imaging device that performs high-speed capturing by storing image data of a plurality of screens in the imaging device by using a CCD memory and reduces missing of information between images.

However, both the arts disclosed in Japanese Patent Application Laid-Open Nos. H08-172584 and 2014-158089 need a plurality of memories to store captured images. Further, the configuration of a system which receives signals may be complex because of a special data output form provided from the imaging device. Consequently, it is difficult to avoid increase in size and price of a whole device.

SUMMARY OF THE INVENTION

The present invention intends to provide an imaging device and an imaging system that can acquire the image at a timing to be captured in response to a trigger signal while suppressing the device configuration from being complex.

According to one aspect of the present invention, provided is an imaging device including a plurality of pixels each including a photoelectric conversion unit that generates charges by photoelectric conversion, a charge holding unit that holds charges transferred from the photoelectric conversion unit, and an output unit that outputs a signal in accordance with an amount of charges held by the charge holding unit, and a control unit that performs a first control, which causes the plurality of pixels to perform an operation that includes an exposure operation of the photoelectric conversion unit, a reset operation of the charge holding unit, and a charge transfer operation from the photoelectric conversion unit to the charge holding unit and updates charges held by the charge holding unit by using the reset operation and the charge transfer operation, and a second control to read out a signal based on charges held by the charge holding unit from each of the plurality of pixels, wherein the control unit repeats the first control at a predetermined cycle without inserting the second control in a first period before a trigger signal is externally input, and wherein the control unit changes the first control to the second control when the trigger signal is externally input after the first period.

Further, according to another aspect of the present invention, provided is an imaging system including an imaging device including a plurality of pixels each including a photoelectric conversion unit that generates charges by photoelectric conversion, a charge holding unit that holds charges transferred from the photoelectric conversion unit, and an output unit that outputs a signal in accordance with an amount of charges held by the charge holding unit, a first control signal generation unit that generates a first control signal used for operating the imaging device in a first operation mode that includes an exposure operation of the photoelectric conversion unit, a reset operation of the charge holding unit, and a charge transfer operation from the photoelectric conversion unit to the charge holding unit and updates charges held by the charge holding unit by using the reset operation and the charge transfer operation, a second control signal generation unit that generates a second control signal used for operating the imaging device in a second operation mode that reads out a signal based on charges held by the charge holding unit from each of the plurality of pixels, and a control unit that controls the first control signal generation unit and the second control signal generation unit, wherein the control unit repeats the first operation mode at a predetermined cycle without inserting the second operation mode in a first period before a trigger signal is externally input, and wherein the control unit changes the first operation mode to the second operation mode when the trigger signal is externally input after the first period.

Further, according to yet another aspect of the present invention, provided is a method of driving an imaging device including a plurality of pixels each including a photoelectric conversion unit that generates charges by photoelectric conversion, a charge holding unit that holds charges transferred from the photoelectric conversion unit, and an output unit that outputs a signal in accordance with an amount of charges held by the charge holding unit, the method including causing the plurality of pixels to perform an operation that includes an exposure operation of the photoelectric conversion unit, a reset operation of the charge holding unit, and a charge transfer operation from the photoelectric conversion unit to the charge holding unit and updates charges held by the charge holding unit by using the reset operation and the charge transfer operation, and reading out a signal based on charges held by the charge holding unit from each of the plurality of pixels, wherein the causing to perform the operation is repeated at a predetermined cycle without inserting the reading out the signal in a first period before a trigger signal is externally input, and wherein the causing to perform the operation is changed to the reading out the signal when the trigger signal is externally input after the first period.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

An imaging system according to a first embodiment of the present invention will be described with reference to FIG. 1 to FIG. 9.

Figure 1:
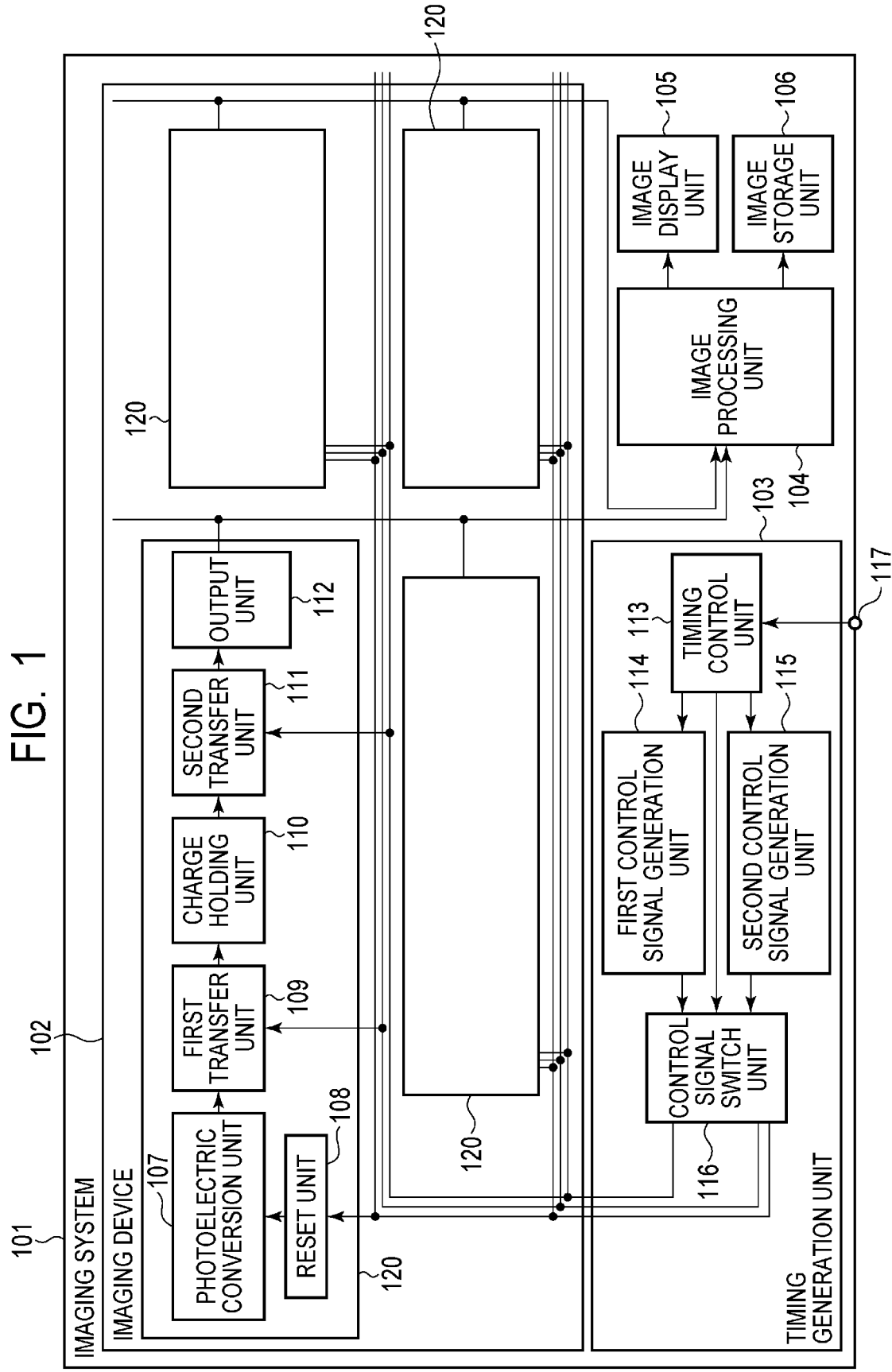
FIG. 1 is a block diagram illustrating a general configuration of an imaging system according to a first embodiment of the present invention.
Figure 2:
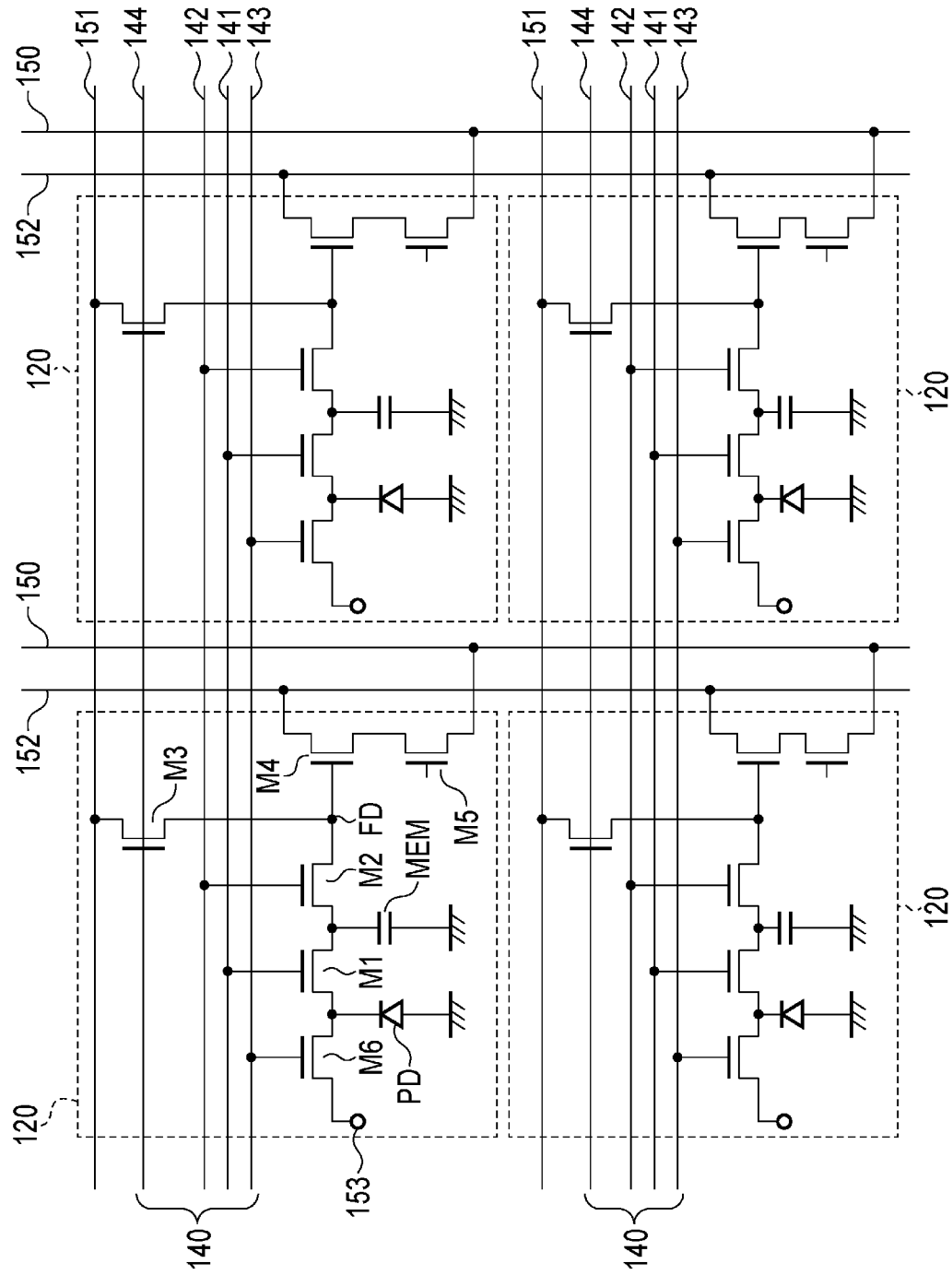
FIG. 2 is a circuit diagram illustrating a configuration example of pixels of an imaging device in the imaging system according to the first embodiment of the present invention.

First, the structure of the imaging system according to the present embodiment will be described by using FIG. 1 and FIG. 2. FIG. 1 is a block diagram illustrating a general configuration of the imaging system according to the present embodiment. FIG. 2 is a circuit diagram illustrating a configuration example of pixels of an imaging device in the imaging system according to the present embodiment.

As illustrated in FIG. 1, an imaging system 101 according to the present embodiment includes an imaging device 102, a timing generation unit 103, an image processing unit 104, an image display unit 105, and an image storage unit 106.

The imaging device 102 includes a plurality of pixels 120 two-dimensionally arranged over a plurality of rows and a plurality of columns. Although FIG. 1 illustrates four pixels 120 arranged in two rows and two columns, the number of pixels 120, the number of rows, and the number of columns forming the imaging device 102 are not particularly limited.

Each of the pixels 120 includes a photoelectric conversion unit 107, a reset unit 108, a first transfer unit 109, a charge holding unit 110, a second transfer unit 111, and an output unit 112. The photoelectric conversion unit 107 has a function of converting an incident light to an electric signal such as charges or the like. The reset unit 108 has a function of resetting a potential of the photoelectric conversion unit 107. The first transfer unit 109 has a function of transferring charges generated and accumulated in the photoelectric conversion unit 107 to the charges holding unit 110. The charge holding unit 110 has a function of temporarily holding charges transferred from the photoelectric conversion unit 107. The second transfer unit 111 has a function of transferring charges held in the charges holding unit 110 to the output unit 112. The output unit 112 has a function of outputting a signal (pixel signal) in accordance with the amount of charges transferred from the charge holding unit 110 to the image processing unit 104.

The timing generation unit 103 has a function of generating control signals to drive the imaging device 102. The timing generation unit 103 includes a timing control unit 113, a first control signal generation unit 114, a second control signal generation unit 115, a control signal switch unit 116, and a trigger signal receive unit 117.

The timing control unit 113 has a function of managing overall control of timings when control signals for driving the imaging device 102 are supplied. The timing control unit 113 is configured to receive a trigger signal from the outside of the imaging system 101 through the trigger signal receive unit 117. The timing control unit 113 controls the first control signal generation unit 114, the second control signal generation unit 115, and the control signal switch unit 116 in response to the received trigger signal. The first control signal generation unit 114 generates and outputs a control signal for driving the imaging device 102 under the control of the timing control unit 113 in a standby exposure mode described below. The second control signal generation unit 115 generates and outputs a control signal for driving the imaging device 102 under the control of the timing control unit 113 in a normal exposure mode described below. Note that the first control signal generation unit 114 outputs the control signal at a shorter cycle interval than the second control signal generation unit 115. The control signal switch unit 116 has a function of selecting a control signal generated by one of the first control signal generation unit 114 and the second control signal generation unit 115 and supplying the selected control signal to the imaging device 102 under the control of the timing control unit 113 in accordance with the operation mode of the imaging device 102. Note that the imaging device 102 may also have at least a part of the function included in the timing generation unit 103.

The image processing unit 104 has a function of performing predetermined image processing on the image signal based on the pixel signal output from each of the pixels 120 of the imaging device 102. For example, the image processing unit 104 has a function of performing a process to convert an image signal in accordance with pixel arrangement of the imaging device 102 such as Bayer arrangement or the like into picture signal such as general RGB signals or YCbCr signals. Further, the image processing unit 104 may also have other functions, for example, an interface (IF) function of generating a display signal for the image display unit 105, an IF function of generating a storage signal for the image storage unit 106, or the like.

The image display unit 105 is formed of a display device such as a liquid crystal element, an EL element, or the like, for example, and has a function of displaying an image processed by the image processing unit 104. The image storage unit 106 is formed of a hard disk drive, a nonvolatile memory, or the like, for example, and has a function of storing an image processed by the image processing unit 104.

FIG. 2 illustrates a configuration example of four pixels 120 arranged in a matrix of two rows and two columns. As illustrated in FIG. 2, each of the pixels 120 may be formed of, for example, a photoelectric conversion element PD, transfer transistors M1 and M2, a charge holding portion MEM, a reset transistor M3, an amplifier transistor M4, a select transistor M5, and a drain transistor M6. The photoelectric conversion element PD corresponds to the photoelectric conversion unit 107 in FIG. 1. The transfer transistor M1 corresponds to the first transfer unit 109 in FIG. 1. The charge holding portion MEM corresponds to the charge holding unit 110 in FIG. 1. The transfer transistor M2 corresponds to the second transfer unit 111 in FIG. 1. The reset transistor M3, the amplifier transistor M4, and the select transistor M5 correspond to the output unit 112 in FIG. 1. The drain transistor M6 corresponds to the reset unit 108 in FIG. 1.

The photoelectric conversion element PD is formed of a photodiode, for example. The anode of the photodiode forming the photoelectric conversion element PD is connected to a ground node, and the cathode thereof is connected to the source of the transfer transistor M1 and the source of the drain transistor M6. The drain of the transfer transistor M1 is connected to the source of the transfer transistor M2. The connection node of the drain of the transfer transistor M1 and the source of the transfer transistor M2 includes a capacitance component and has a function as the charge holding portion MEM. In FIG. 2, this capacitance component is represented as a capacitor, one terminal of which is connected to the node. The other terminal of the capacitor is connected to the ground node.

The drain of the transfer transistor M2 is connected to the source of the reset transistor M3 and the gate of the amplifier transistor M4. The connection node of the drain of the transfer transistor M2, the source of the reset transistor M3, and the gate of the amplifier transistor M4 is a so-called floating diffusion portion FD. The floating diffusion portion FD includes a capacitance component (floating diffusion capacitor) and has a function as a charge holding portion. The source of the amplifier transistor M4 is connected to the drain of the select transistor M5.

The drain of the reset transistor M3 is connected to a reset line 151 to supply a predetermined reset voltage. The drain of the amplifier transistor M4 is connected to a power supply line 152. The drain of the drain transistor M6 is connected to a power supply node 153 such as overflow drain to supply a predetermined voltage. Note that any two or three of the voltages of the reset line 151, the power supply line 152, and the power supply node 153 may be the same, or all of them may be different from each other.

On each row of the pixel array, a control line 140 used for supplying control signals for driving the pixels 120 belonging to the corresponding row is arranged. Each of the control lines 140 includes signal lines 141, 142, 143, and 144. The signal line 141 is connected to the gates of the transfer transistors M1 of the pixels 120 belonging to the corresponding row. The signal line 142 is connected to the gates of the transfer transistors M2 of the pixels 120 belonging to the corresponding row. The signal line 143 is connected to the gate of the drain transistor M6 of the pixel 120 belonging to the corresponding row. The signal line 144 is connected to the gate of the reset transistor M3 of the pixel 120 belonging to the corresponding row. Note that, although not illustrated in FIG. 2, each of the control lines 140 further includes a signal line connected to the gate of the select transistor M5 of the pixel 120 belonging to the corresponding row.

A control signal φGS1 that includes driving pulses for controlling the transfer transistor M1 is output to the signal line 141. A control signal φTX1 that includes driving pulses for controlling the transfer transistor M2 is output to the signal line 142. A control signal φOFD that includes driving pulses for controlling the drain transistor M6 is output to the signal line 143. A control signal φRES that includes driving pulses for controlling the reset transistor M3 is output to the signal line 144. When each transistor is formed of an n-channel transistor, the corresponding transistor is turned on when a high level control signal is supplied. Further, the corresponding transistor is turned off when a low level control signal is supplied. Note that, in FIG. 1, although illustration is omitted for simplicity of the drawing, in general, these control signals φGS1, φTX1, and φOFD output from the control signal switch unit 116 are configured to be supplied from a vertical scanning circuit (not illustrated) on a row basis.

On each column of the pixel array, an output line 150 connected to the source of the select transistor M5 of the pixel 120 belonging to the corresponding column is connected. A pixel signal read out from the pixel 120 belonging to the selected row on the corresponding column is output to the output line 150. Note that, in FIG. 1, although illustration is omitted for simplicity of the drawing, in general, the pixel signals output to the output line 150 of each column are configured to be transferred to the image processing unit 104 for each column selected by a horizontal scanning circuit (not illustrated).

Once an optical image of an object enters the imaging device 102, the photoelectric conversion element PD of each pixel 120 converts (photoelectrically converts) the incident light into an amount of charges corresponding to the amount of light, and the generated charges (for example, electrons) are accumulated.

When turned on, the transfer transistor M1 transfers charges (signal charges) accumulated in the photoelectric conversion element PD to the charge holding portion MEM. The charge holding portion MEM holds the charges generated in the photoelectric conversion element PD in a place different from the photoelectric conversion element PD.

When turned on, the transfer transistor M2 transfers signal charges held in the charge holding portion MEM to the floating diffusion portion FD. The floating diffusion portion FD holds the signal charges transferred from the charge holding portion MEM and has a voltage corresponding to the amount of the transferred signal charges generated by charge-to-voltage conversion caused by the capacitance component.

The amplifier transistor M4 has a configuration in which a power supply voltage is supplied to the drain and a bias current is supplied to the source via the select transistor M5 and forms an amplifier unit (source follower circuit) having a gate as an input node. Consequently, the amplifier transistor M4 outputs a pixel signal corresponding to the voltage of the floating diffusion portion FD to the output line 150 via the select transistor M5.

When turned on, the select transistor M5 connects the amplifier transistor M4 to the output line 150. That is, when turned on, the select transistor M5 selects the pixel 120 which outputs the pixel signal to the output line 150. Note that the pixel 120 is not necessarily required to include the select transistor M5.

When turned on, the reset transistor M3 resets the floating diffusion portion FD to a predetermined voltage corresponding to the reset voltage. Further, when the reset transistor M3 and the transfer transistor M2 are simultaneously turned on, it is also possible to reset the charge holding portion MEM to a voltage corresponding to a reset voltage.

When turned on, the drain transistor M6 drains charges of the photoelectric conversion element PD to the power supply node 153 and resets the photoelectric conversion element PD to a predetermined voltage corresponding to the voltage of the power supply node 153. By allowing resetting of the photoelectric conversion element PD by the drain transistor M6, flexibility in the setting of a charge accumulation time period in the photoelectric conversion element PD is improved. Note that the pixel 120 is not necessarily required to include the drain transistor M6.

When reading out pixel signals from the pixels 120 on a plurality of rows, in an imaging device without the charge holding portion MEM, the transfer transistors of pixels on respective rows are sequentially driven on a row basis. On the other hand, in the imaging device 102 of the present embodiment with the charge holding portion MEM, an operation of simultaneously transferring signal charges of the photoelectric conversion elements PD of the pixels 120 on all the rows to the charge holding portions MEM, that is, all-pixel simultaneous transfer can be performed. After simultaneous transfer of all the pixels, the photoelectric conversion elements PD are in an empty state, that is, an initial state, and the next exposure period can be started. Alternatively, by the drain transistors M6 of the pixels 120 on all the rows being simultaneously turned on, the photoelectric conversion elements PD are in an empty state, that is, an initial state, and the next exposure period can be started. That is, in the imaging device 102 according to the present embodiment, an operation of controlling the start of exposure and the end of exposure at the same time for all the pixels, that is, an all-pixel simultaneous electronic shutter operation (global electronic shutter operation) can be performed.

Figure 3:
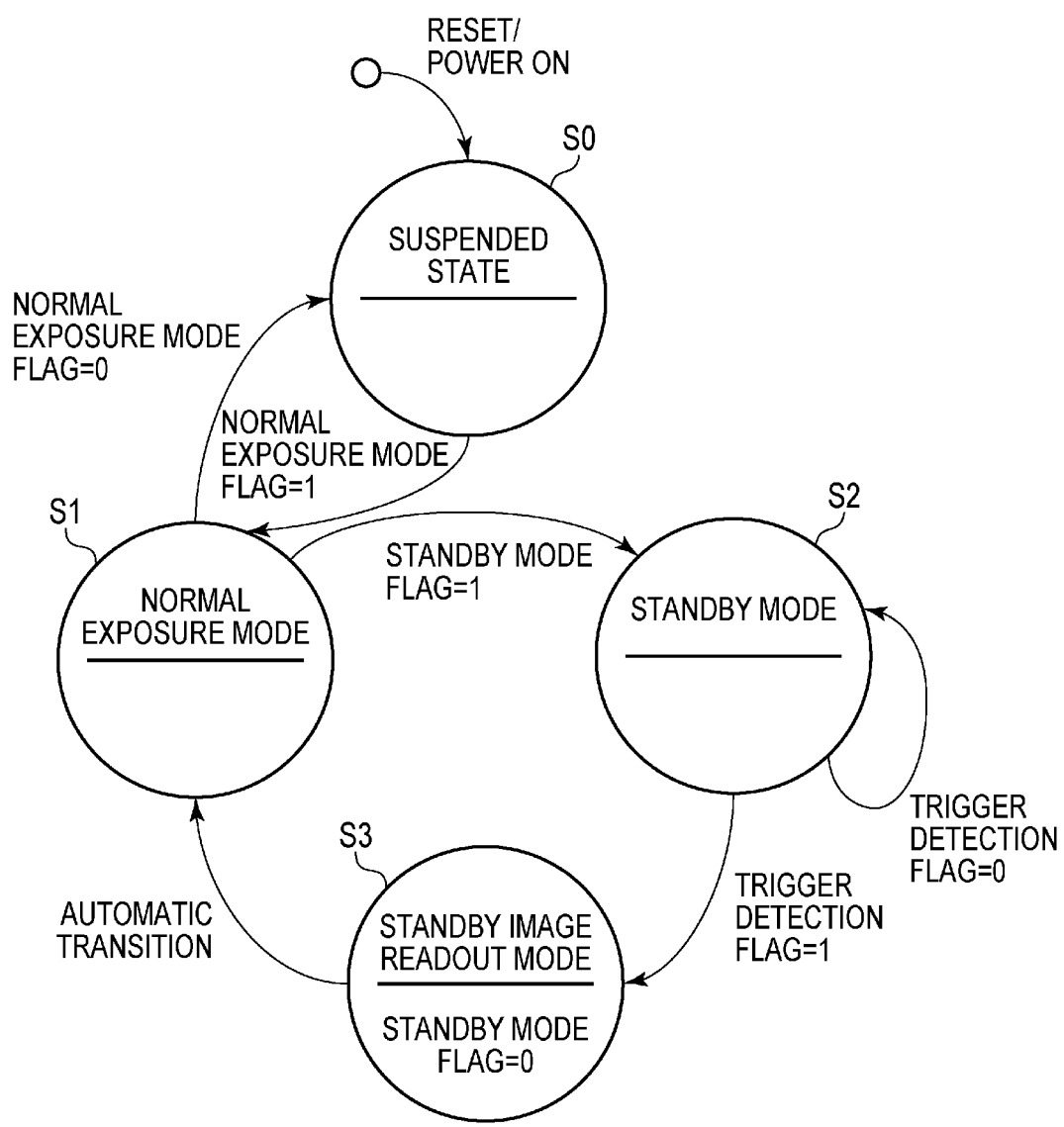
FIG. 3 is a state transition diagram illustrating an operation of the imaging system according to the first embodiment of the present invention.
Figure 4:
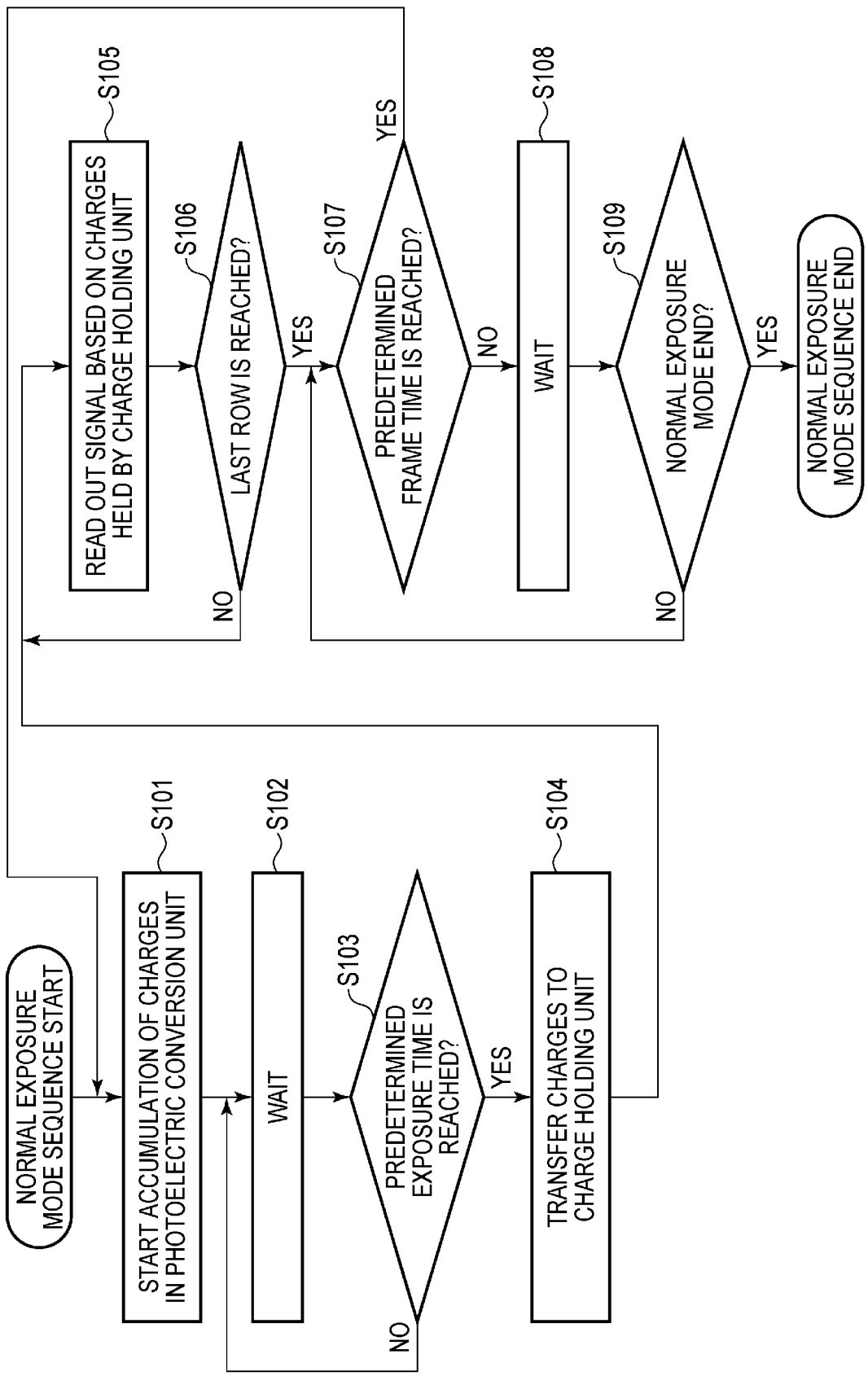
FIG. 4 is a flowchart illustrating an operation in a normal exposure mode of the imaging system according to the first embodiment of the present invention.
Figure 5:
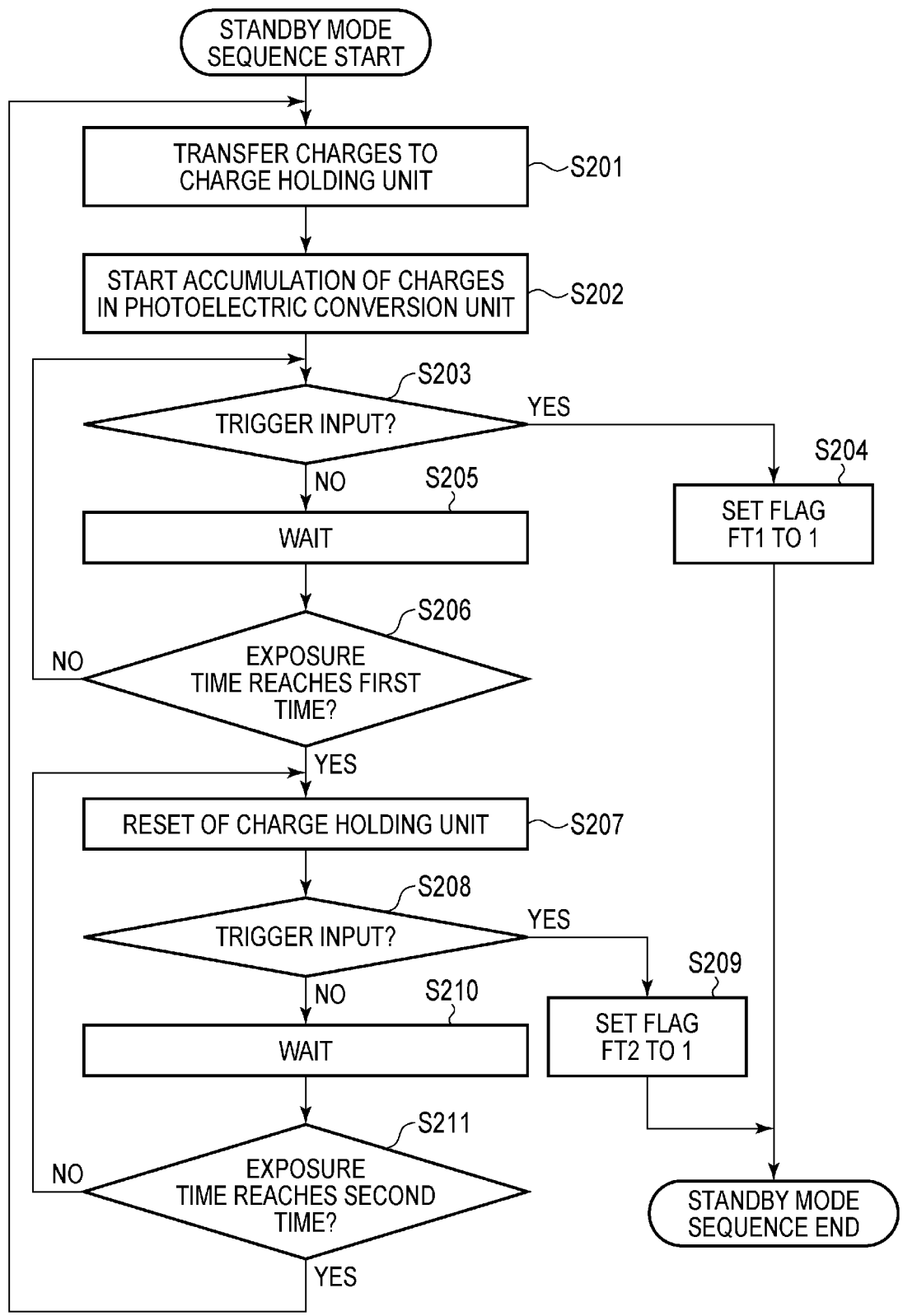
FIG. 5 is a flowchart illustrating an operation in a standby mode of the imaging system according to the first embodiment of the present invention.
Figure 6:
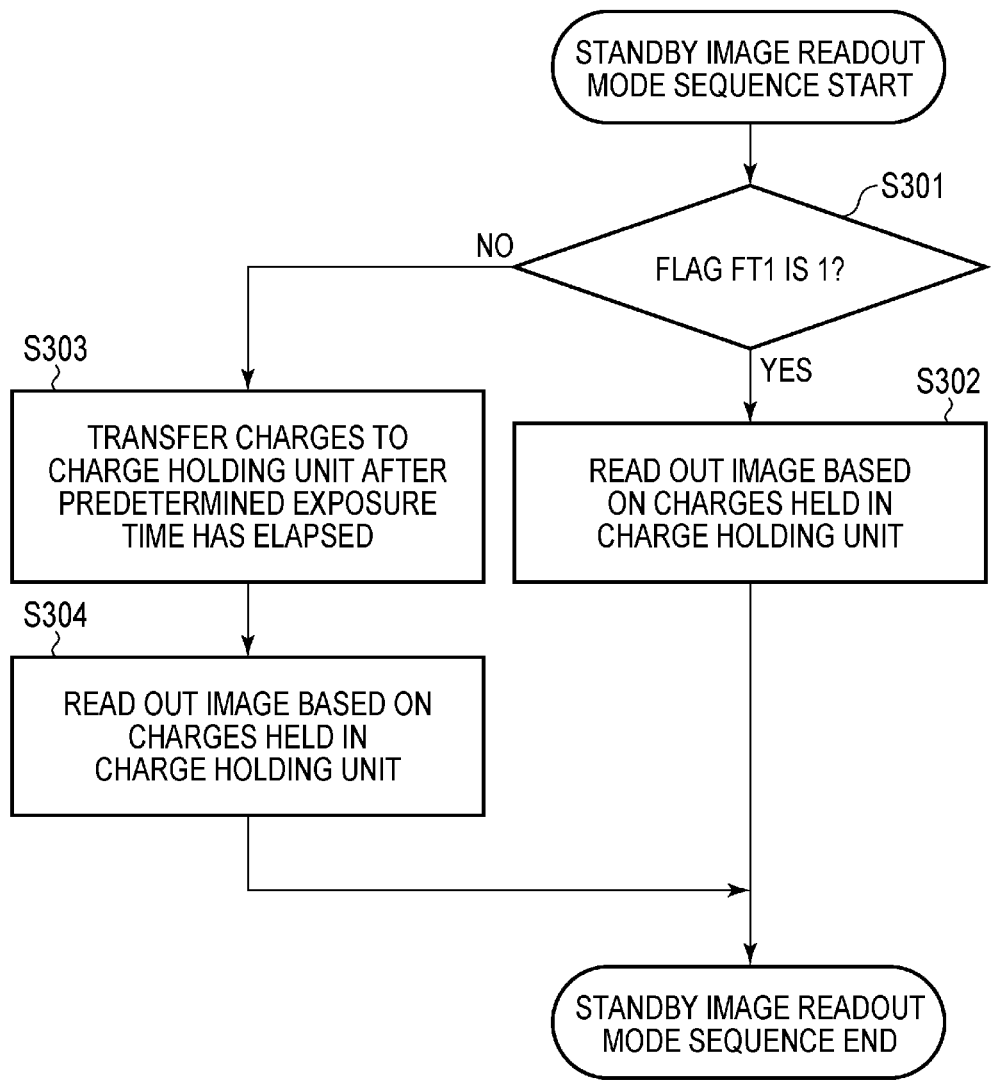
FIG. 6 is a flowchart illustrating an operation in a standby image readout mode of the imaging system according to the first embodiment of the present invention.
Figure 7:
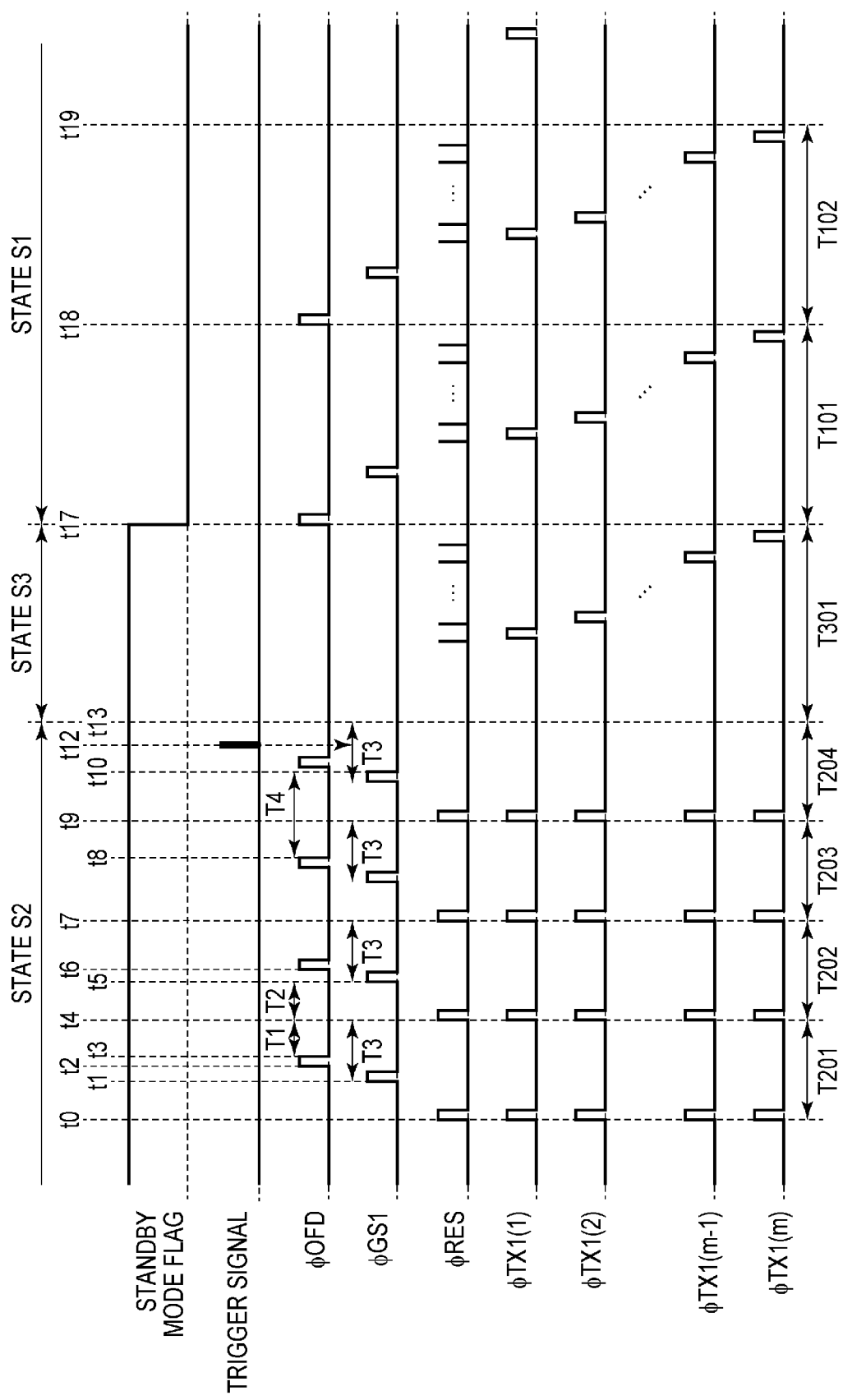
FIG. 7 and FIG. 8 are timing charts illustrating a method of driving the imaging system according to the first embodiment of the present invention.
Figure 8:
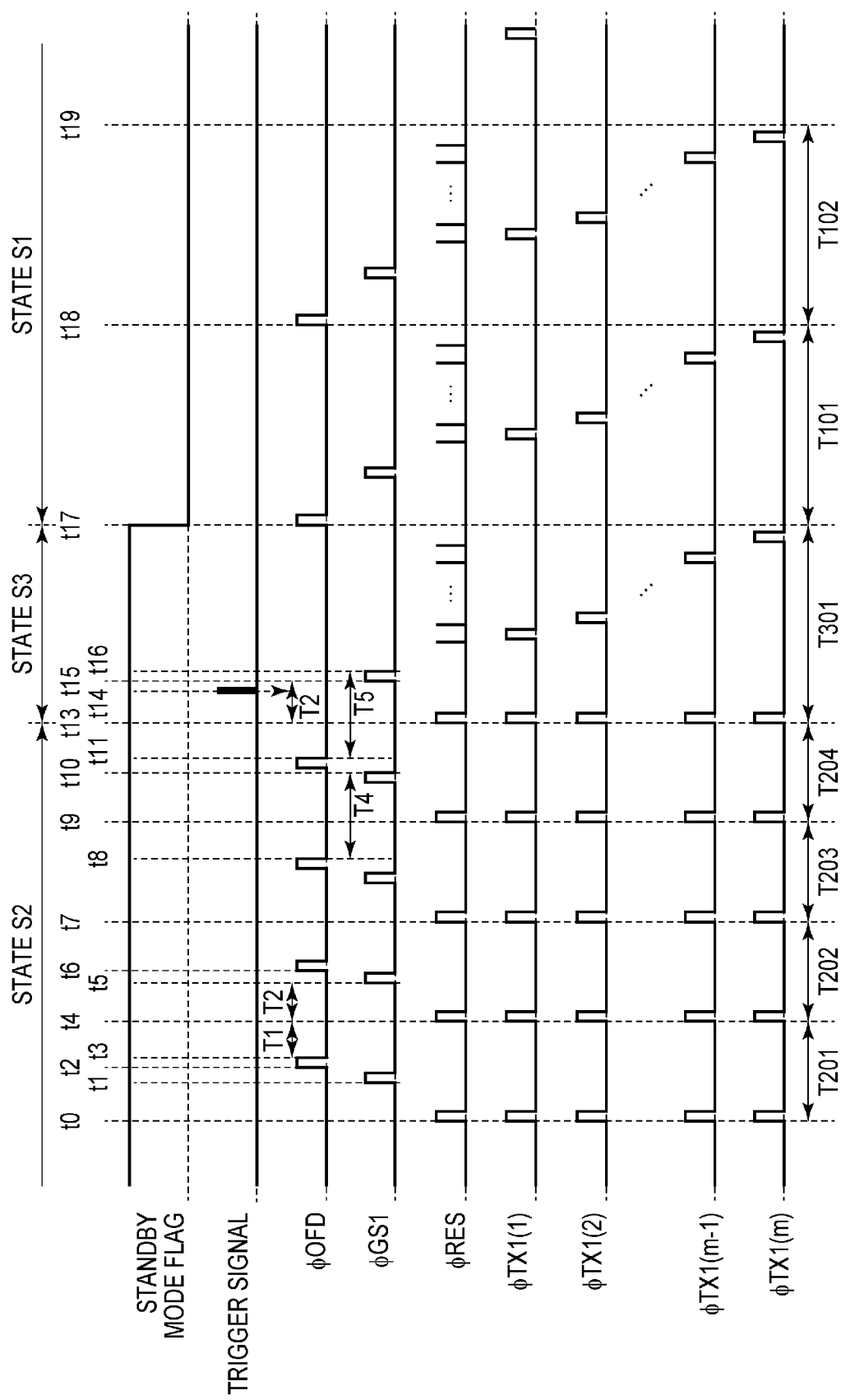

Next, the operation of the imaging system according to the present embodiment will be described by using FIG. 3 to FIG. 8. FIG. 3 is a state transition diagram illustrating an operation of the imaging system according to the present embodiment. FIG. 4 to FIG. 6 are flowcharts illustrating the operation of the imaging system according to the present embodiment. FIG. 7 and FIG. 8 are timing charts illustrating a method of driving the imaging system according to the present embodiment.

As illustrated in FIG. 3, the imaging system 101 according to the present embodiment has a state S0 as a suspension state, a state S1 as a normal exposure mode, a state S2 as a standby mode, and a state S3 as a standby image readout mode. Note that, in this specification, the standby mode may be referred to as a first operation mode, the normal exposure mode may be referred to as a second operation mode.

The state S0 is a suspension state with no operation immediately after powering on or after executing reset. When the normal exposure mode is selected in the state S0, a normal exposure mode flag becomes 1, and the state transitions to the state S1 that is the normal exposure mode.

In the state S1, the imaging system 101 is in a state where normal capturing is repeatedly performed. When transition to the suspension state is selected in the state S1, the normal exposure mode flag becomes 0, and the state transitions to the state S0. When the standby mode waiting for capturing by a trigger signal is selected in the state S1, the standby mode flag becomes 1, and the state transitions to the state S2 that is the standby mode state.

In the state S2, the imaging system 101 is in a state of waiting for an external input of a trigger signal. While waiting for input of a trigger signal, the imaging system 101 performs a standby exposure operation to repeatedly sample and update charges for the charge holding unit 110. While the imaging system 101 does not detect the input of the trigger signal, that is, while the trigger detection flag is 0, the imaging system 101 maintains the state S2. On the other hand, when a trigger signal is input from the outside to the imaging system 101 via the trigger signal receive unit 117 during the operation in the standby mode and it is detected that the trigger detection flag becomes 1, the state transitions to the state S3 that is the standby image readout mode state.

In the state S3, the imaging system 101 performs readout of a standby image for one frame based on the charges held in the charge holding unit 110 of each pixel 120 in the standby exposure operation. Then, the imaging system 101 changes the standby mode flag back to 0 from 1 and automatically transitions to the state S1 that is the normal exposure mode state.

In such a way, after readout of one frame of a standby image in response to receiving the trigger signal, a series of sequences to transition from the standby mode to the normal exposure mode are performed.

FIG. 4 is a flowchart illustrating the operation of the imaging system 101 in the state S1 in a simplified manner. In response to transition from the state S0 to the state S1, the normal exposure mode sequence in the imaging system 101 illustrated in FIG. 4 is started.

First, in step S101, the photoelectric conversion unit 107 is reset by the reset unit 108 and accumulation of charges by the photoelectric conversion unit 107 is started under the control of the timing generation unit 103. The timing to start accumulation of charges in the photoelectric conversion unit 107 is the start time of the exposure period.

Next, in step S102, after standby until a predetermined wait time has elapsed, the process proceeds to step S103.

Next, in step S103, it is determined whether or not the exposure time of the photoelectric conversion unit 107 reaches a predetermined exposure time. As a result of the determination, if the predetermined exposure time is not reached (step S103, "NO"), the process returns to step S102, and if the predetermined exposure time is reached (step S103, "YES"), the process proceeds to step S104.

Next, in step S104, the first transfer unit 109 is driven, and charges accumulated in the photoelectric conversion unit 107 during the exposure time are transferred to the charge holding unit 110.

Next, in step S105, one row of the imaging device 102 is selected, the second transfer unit 111 of the pixel 120 belonging to the selected row is driven, and a signal based on charges held in the charge holding unit 110 of the pixel 120 belonging to the selected row is output via the output unit 112. In such a way, pixel signals for one row of the selected row are output.

Next, in step S106, it is determined whether or not the row count value reaches the last row. As a result of the determination, if the row count value does not reach the last row (step S106, "NO"), the row count value is incremented by 1, and the process returns to step S105. On the other hand, if the row count value reaches the last row (step S106, "YES"), the process proceeds to step S107.

Next, in step S107, it is determined whether or not a predetermined frame time corresponding to one frame period has elapsed. As a result of the determination, if the predetermined frame time has elapsed (step S107, "YES"), the process returns to step S101 to perform exposure of the next frame and readout of an image. If the predetermined frame time is not reached (step S107, "NO"), the process proceeds to step S108.

Next, in step S108, after standby until a predetermined wait time has elapsed, the process proceeds to step S109.

Next, in step S109, it is determined whether or not to terminate the normal mode in accordance with an instruction of a transition to the suspension state or the like. As a result of the determination, if the normal mode is not terminated (step S109, "NO"), the process returns to step S107, and if the normal mode is terminated (step S109, "YES"), a series of normal exposure mode sequences end.

FIG. 5 is a flowchart illustrating the operation of the imaging device 102 in the state S2 in a simplified manner. In response to transition from the state S1 to the state S2, a standby mode sequence illustrated in FIG. 5 is started in the imaging device 102.

First, in step S201, the first transfer unit 109 is driven, and charges accumulated in the photoelectric conversion unit 107 are transferred to the charge holding unit 110 under the control of the timing generation unit 103.

Next, in step S202, the photoelectric conversion unit 107 is reset by the reset unit 108 to start accumulation of charges in the photoelectric conversion unit 107 under the control of the timing generation unit 103. The timing when accumulation of charges in the photoelectric conversion unit 107 is started is the start time of an exposure period.

Next, in step S203, it is determined whether or not a trigger signal is input. As a result of the determination, if a trigger signal is input (step S203, "YES"), the process proceeds to step S204, a trigger detection flag FT1 is set to 1 indicating that a trigger signal has been input at this stage, and the standby mode sequence ends. If no trigger signal is input (step S203, "NO"), the process proceeds to step S205.

Next, in step S205, after standby until a predetermined wait time has elapsed, the process proceeds to step S206.

Next, in step S206, it is determined whether or not the exposure period of the photoelectric conversion unit 107 reaches the first time. As a result of the determination, if the first time is reached (step S206, "NO"), the process returns to step S203, and if the first time is not reached (step S206, "YES"), the process proceeds to step S207. Note that the first time here will be described later. Next, in step S207, the charge holding unit 110 is reset.

Next, in step S208, it is determined whether or not a trigger signal is input. If a trigger signal is input as a result of the determination (step S208, "YES"), the process proceeds to step S209, a trigger detection flag FT2 is set to 1 indicating that a trigger signal has been input at this stage, and the standby mode sequence ends. If no trigger signal is input (step S208, "NO"), the process proceeds to step S210.

Next, in step S210, after standby until a predetermined wait time has elapsed, the process proceeds to step S211.

Next, in step S211, it is determined whether or not the exposure time period of the photoelectric conversion unit 107 reaches the second time. As a result of determination, if the second time is not reached (step S211, "NO"), the process returns to step S207, and if the second time is reached (step S211, "YES"), the process returns to step S201. Note that the second time here will be described later.

In such a way, in the state S2, while detection of a trigger signal being waited for, reset of the charge holding unit 110 and charge transfer from the photoelectric conversion unit 107 to the charge holding unit 110 are repeated, and charges held by the charge holding unit 110 are sequentially updated.

FIG. 6 is a flowchart illustrating the operation of the imaging device 102 in the state S3 in a simplified manner. Once the state S2 transitions to the state S3, a standby image readout mode sequence illustrated in FIG. 6 is started in the imaging device 102.

First, in step S301, it is determined whether or not the trigger detection flag set in the state S2 is the trigger detection flag FT1 set in step S204. If the flag set in the state S2 is the trigger detection flag FT1 (step S301, "YES", FT1=1, FT2=0), the process proceeds to step S302. Next, in step S302, an image based on charges held in the charge holding unit 110 is output, and a standby image readout mode sequence ends.

On the other hand, if the flag set in the state S2 is not the trigger detection flag FT1 (step S301, "NO", FT1=0, FT2=1), the process proceeds to step S303. In step S303, the ongoing exposure period in the photoelectric conversion unit 107 continues until reaching a predetermined time, and the accumulated charges are then transferred to the charge holding unit 110. Next, in step S304, an image based on charges held in the charge holding unit 110 is output, and the standby image readout mode sequence ends.

In such a way, in the state S3, in accordance with the timing when a trigger signal is input, it is selected which image information accumulated in the standby mode to read out, and the selected image information is output. Here, the read out image corresponds to an image containing information resulted immediately before the trigger signal is input.

Next, the operation of the imaging device according to the present embodiment will be described in more detail by using timing charts of FIG. 7 and FIG. 8. FIG. 7 and FIG. 8 illustrate the standby mode flag, the trigger signal, and the control signals $\phi$OFD, $\phi$GS1, $\phi$RES, and $\phi$TX1(1) to $\phi$TX1(m). Note that the control signal $\phi$TX1(1) is the control signal $\phi$TX1 supplied to the pixel 120 on the first row, and the control signal $\phi$TX1(2) is the control signal $\phi$TX1 supplied to the pixel 120 on the second row. Further, the control signal $\phi$TX1(m−1) is the control signal $\phi$TX1 supplied to the pixel 120 on the (m−1)-th row, and the control signal $\phi$TX1(m) is the control signal $\phi$TX1 supplied to the pixel 120 on the m-th row.

FIG. 7 and FIG. 8 illustrate one example of the operation from the state S2 to the state S1 via the state S3. In FIG. 7 and FIG. 8, the period from the time t0 to the time t13 is a period of the state S2, the period from the time t13 to the time t17 is a period of the state S3, and the period on and after the time t17 is a period of the state S1.

In the state S2, at the same time for all the pixels 120, a sampling operation including a reset operation of the photoelectric conversion unit 107, an exposure operation to accumulated charges in the photoelectric conversion unit 107, and a charge transfer operation to transfer charges from the photoelectric conversion unit 107 to the charge holding unit 110 is repeated. A reset operation of the charge holding unit 110 is performed between sampling operations. Here, the sampling operation refers to a series of operations after the photoelectric conversion unit 107 generates charges in accordance with the amount of a light entering the pixel 120 and before the charge holding unit 110 holds the charges. A period in which an exposure operation is performed is an exposure period. The length of an exposure period corresponds to an exposure time period.

In FIG. 7 and FIG. 8, consecutive four unit periods T201, T202, T203, and T204 are defined as unit periods each including one time of sampling operation. Each of the unit periods T201, T202, T203, and T204 includes an exposure period sufficient to obtain one image. The length of each of the unit periods T201, T202, T203, and T204 corresponds to the length of one frame period in a standby mode.

The reset operation of the photoelectric conversion unit 107 is performed by supplying a high level control signal φOFD from the first control signal generation unit 114 to the reset unit 108 of the pixel 120 via the control signal switch unit 116. Specifically, the drain transistor M6 is turned on in response to a high level control signal φOFD, and thereby charges accumulated in the photoelectric conversion element PD are drained to the power source node 153, and the photoelectric conversion element PD is reset to a potential in accordance to the voltage of the power source node 153.

A charge transfer operation from the photoelectric conversion unit 107 to the charge holding unit 110 is performed by supplying a high level control signal φGS1 from the first control signal generation unit 114 to the first transfer unit 109 of the pixel 120 via the control signal switch unit 116. Specifically, the transfer transistor M1 is turned on in response to a high level control signal φGS1, and thereby charges accumulated in the photoelectric conversion element PD are transferred to the charge holding portion MEM.

A reset operation of the charge holding unit 110 is performed by supplying high level control signals φTX1 and φRES to the second transfer unit 111 and the output unit 112 of the pixel 120 from the first control signal generation unit 114 via the control signal switch unit 116. Specifically, the transfer transistor M2 is turned on in response to the high level control signal φTX1, the reset transistor M3 is turned on in response to the high level control signal φRES, and thereby the charge holding portion MEM is reset to a predetermined potential in accordance with the voltage of the reset line 151.

At the time t2, the control signal φOFD transitions to a high level, and the photoelectric conversion elements PD of the pixels 120 belonging to all the rows are reset. The time t3 when the control signal φOFD transitions to a low level corresponds to the start time of an exposure period of the photoelectric conversion element PD.

Next, at the time t4, the control signals φRES and φTX1 (φTX1(1), φTX1(2), . . . , φTX1(m−1), φTX1(m)) transition to a high level, and the charge holding portions MEM of the pixels 120 belonging to all the rows are reset. Here, the time t4 is the time when a period T1 has elapsed from the time t3. The period T1 is defined as a period in which sufficient charges to form an image are accumulated in the photoelectric conversion element PD. The length of the period T1 corresponds to the first period described above.

Next, at the time t5, the control signal φGS1 transitions to a high level, charges accumulated in the photoelectric conversion element PD are transferred to the charge holding portion MEM in each of the pixels 120 belonging to all the rows. The time t5 is the time after a period T2 has elapsed from the time t4 and corresponds to the time t1 in the previous unit period T201. The period T2 is a period in which the charge holding portion MEM holds no charges. On the other hand, a period T3 from the timing when the control signal φGS1 transitions to a high level (for example, the time t5) to the timing when the control signals φRES and φTX1 next transition to a high level (for example, the time t7) is a period in which the charge holding portion MEM holds charges.

Since charges that have been accumulated in the photoelectric conversion element PD so far can be used to form an image in response to an exposure period of the photoelectric conversion element PD exceeding the period T1, a charge transfer operation from the photoelectric conversion element PD to the charge holding portion MEM is performed after the period T1 has elapsed. Further, since charges accumulated in the photoelectric conversion element PD cannot be used to form an image until an exposure period of the photoelectric conversion element PD exceeds the period T1, charges of the charge holding portion MEM remains to be held. That is, the reset operation of the charge holding portion MEM can be performed prior to a charge transfer operation from the photoelectric conversion element PD to the charge holding portion MEM after the period T1 has elapsed.

Next, on and after the time t6 when the control signal φGS1 transitions to a low level, the operation from the time t2 to the time t6 is repeatedly performed, and charges sampled in the charge holding portion MEM are updated at the interval of the unit periods T201, T202, T203, and T204.

Transition from the state S2 to the state S3 is performed in response to detection of input of a trigger signal. FIG. 7 illustrates an operation example when a trigger signal is input at the time t12 in the period T3 in the unit period T204. FIG. 8 illustrates an operation example when a trigger signal is input at the time t14 in the period T2. The specific operation in accordance with input of a trigger signal will be described later.

In the state S3, readout of a signal based on charges sampled to the charge holding portion MEM in the unit period T204 of the state S2 is performed on a row basis. Specifically, the control signals φTX1 and φRES are supplied to the second transfer unit 111 and the output unit 112 of the pixel 120 from the second control signal generation unit 115 via the control signal switch unit 116 at a predetermined timing. Thereby, reset of the floating diffusion unit FD and transfer of charges from the charge holding portion MEM to the floating diffusion portion FD are performed sequentially on a row basis to read out a pixel signal from each of the pixels 120. Note that in FIG. 7 and FIG. 8, a period when the state S3 is implemented is defined as a unit period T301.

Upon completion of readout of signals from the pixels 120 belonging to all the rows in the state S3, the standby mode flag transitions to a low level at the time t17, the state transitions to a normal exposure mode (state S1).

In the state S1, in each of the frame periods defined by the unit periods T101, T102, . . . , an exposure operation of the photoelectric conversion elements PD and a readout operation of signals based on charges generated by the photoelectric conversion elements PD are performed in the same manner as the normal global electronic shutter operation. The readout operation is performed sequentially on a row basis. Specifically, the control signals ϕOFD, ϕGS1, ϕTX1, and (ϕRES are supplied to the reset unit 108, the first transfer unit 109, the second transfer unit 111, and the output unit 112 of the pixels 120 from the second control signal generation unit 115 via the control signal switch unit 116 at a predetermined timing. Thereby, the exposure operation of the photoelectric conversion element PD and the charge transfer operation to the charge holding portion MEM are performed at the same timing in all the pixels 120. Then, reset of the floating diffusion portion FD and the charge transfer from the charge holding portion MEM to the floating diffusion portion FD are performed sequentially on a row basis, and thereby a pixel signal is read out from each of the pixels 120.

Since, unlike in the state S3, the readout operation of pixel signals is performed in the state S1, each frame period in the state S1 (unit period T101, T102) is longer than each frame period in the state S2 (unit period T201, T202, T203, T204).

As illustrated in FIG. 7, it is assumed here that a trigger signal is input at the time t12 in the period T3. In this case, charges generated by the photoelectric conversion element PD during the period T4 from the time t8 to the time t10 have been held in the charge holding portion MEM at the timing of the time t12, a standby image is generated based on these charges held by the charge holding portion MEM. That is, after the period T3 in which the charge holding portion MEM holds charges has elapsed in the unit period T204, the state transitions to the standby image readout mode (state S3) without reset of the charge holding portion MEM.

On the other hand, as illustrated in FIG. 8, it is assumed that a trigger signal is input at the time t14 in the period T2. In this case, at the timing of the time t14, charges generated by the photoelectric conversion element PD and transferred to the charge holding portion MEM during the period T4 have been reset, and the charge holding portion MEM holds no charges. Accordingly, the end of the exposure period (period T5) including the time t14 is waited for, and a standby image is generated based on charges generated by the photoelectric conversion element PD during the period T5. That is, after the period T2 has elapsed from the time t13, charges accumulated in the photoelectric conversion element PD in the period from the time t15 to the time t16 are transferred to the charge holding portion MEM, and the state transitions to a readout operation in the standby image readout mode (state S3). The length of the period T5 corresponds to the second time period described above.

Next, an application example of the imaging system according to the present embodiment will be described. While not particularly limited, the imaging system according to the present embodiment is applicable to an industrial use camera or a professional use camera that captures a short time occurrence event in response to a trigger signal input at a desired timing, for example. Alternatively, the imaging system according to the present embodiment is applicable to a camera which is a normal digital camera that can acquire a still image or a moving image of 30 to 60 frames per second but has a high-speed capturing function that enables capturing at a short moment in response to an input trigger signal.

Figure 9:
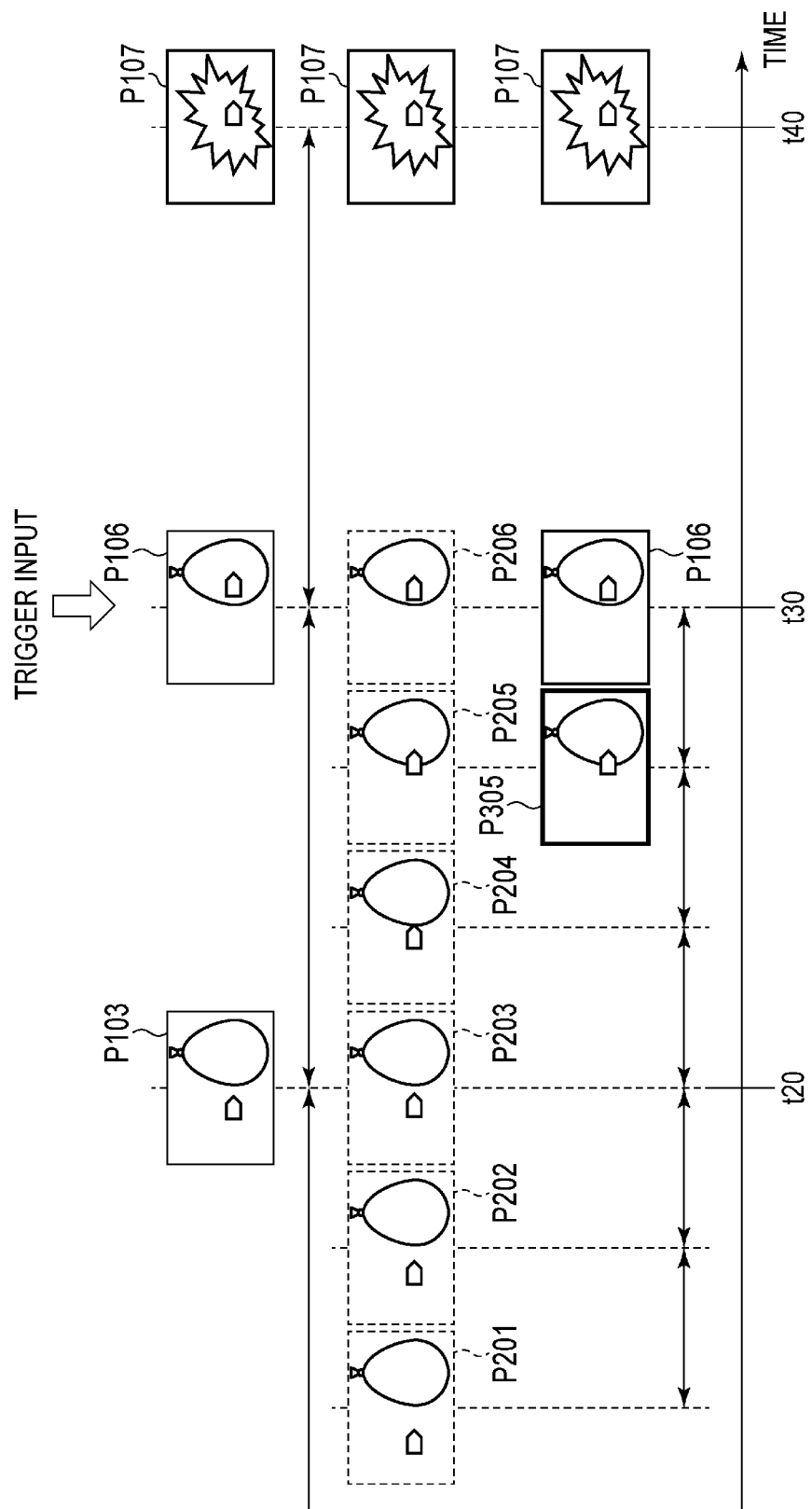
FIG. 9 is a schematic diagram illustrating an image captured at a short time which includes a view of a bullet hitting a balloon to a view of the balloon bursting.

FIG. 9 is a schematic diagram illustrating an image captured at a short time which includes a view of a bullet hitting a balloon to a view of the balloon bursting. Three frames of images P103, P106, and P107 illustrated on the top row of FIG. 9 correspond to a continuous image captured in the normal exposure mode. Six frames of images P201, P202, P203, P204, P205, and P206 illustrated with frames of dotted lines in the middle row of FIG. 9 correspond to a continuous image expected when an image is generated based on charges generated by the photoelectric conversion element PD during each of unit periods in the standby mode. Here, a case where the length of a frame period in a normal exposure mode is three times the length of a frame period in the standby mode is assumed. The image P305 of one frame illustrated with a frame of a bold solid line on the bottom row of FIG. 9 corresponds to an image read out in the standby image readout mode.

To prevent shaking or blurring of an image in high-speed capturing, the exposure period of a photoelectric conversion element PD in each frame period is set to be shorter than one frame cycle. Thus, capturing in the normal exposure mode results in the intermittent change of the positional relationship between the bullet and the balloon in the captured continuous image as illustrated on the top row of FIG. 9.

Here, a case where a trigger signal is input at the time t30 as a timing intended to observe is assumed. In this case, after the image P106 is obtained at the time t30, the image P107 is obtained at the time t40. In this case, however, the image P106 acquired in response to input of a trigger signal corresponds to a state where the bullet has already entered the balloon, and an image at a moment when the bullet hits the balloon cannot be acquired.

On the other hand, in the imaging system according to the present embodiment, it is possible to perform standby exposure at a short exposure cycle corresponding to the images P201, P202, P203, P204, P205, and P206 in time bands corresponding to the images P103 and P106, as illustrated on the middle row of FIG. 9, for example. Therefore, when a trigger signal is input at the time t30, it is possible to read out not only the image P106 corresponding to the timing at the time t30 but also the image P305 corresponding to the standby exposure period in the immediately previous cycle. Therefore, according to the imaging system according to the present embodiment, when high-speed capturing is performed, it is possible to reduce a likelihood of missing a timing to be captured.

In such a way, in the normal exposure mode, since in one frame period includes a period for reading out an image in addition to an exposure period, there is a blanking period in which no capturing is performed. In contrast, since no readout of an image is performed in the standby mode in the present embodiment, it is possible to set the length of one frame period to be close to the length of an exposure period. Therefore, according to the present embodiment, it is possible to prevent missing of an image at an immediately previous moment that has substantially no time difference with respect to the timing when a trigger signal is input.

When the imaging system 101 according to the present embodiment is configured, the imaging device 102 is not required to have any special configuration as long as it has a charge holding unit that can perform reset without reading out an image and has a configuration that can change the exposure cycle between the normal exposure and the standby exposure. It is therefore possible to realize an imaging device that can acquire an image immediately before a trigger signal is input while preventing deterioration of image quality due to a reduction in the number of pixels or the opening ratio without significantly affecting the integration density of the imaging device 102.

Note that, in the present embodiment, the imaging device 102 having the pixels 120 each including the transfer transistor M2 and the charge holding portion MEM and having a global electronic shutter function has been illustrated as an example. However, the feature that the pixels 120 has a global electronic shutter function is not an essential configuration to be provided to the imaging device 102 of the present embodiment. The essence of the present invention is to have a function that can hold charges as image information for one screen in parallel to holding charges being accumulated in the photoelectric conversion element PD.

Therefore, as long as a pixel configuration is capable of the standby exposure operation to perform next exposure without reading out an image, the same advantage as the present embodiment can be obtained. For example, the present invention is also applicable to a rolling shutter pixel configuration in which a charge holding portion formed of the floating diffusion portion FD is arranged on the post-stage of the transfer transistor M1 without having the transistor M2. In such a case, the same standby exposure operation as described in the present embodiment can be realized when charges are transferred from the photoelectric conversion element PD to the floating diffusion portion FD and held therein and, on the other hand, accumulation of charges in the photoelectric conversion element PD is performed in parallel.

Further, in the present embodiment, the first transfer unit 109 preferably has a function of fully transferring charges accumulated in the photoelectric conversion unit 107 to the charge holding unit 110. Further, the reset unit 108 preferably has a function of fully resetting charges accumulated in the photoelectric conversion unit 107. Further, the second transfer unit 111 preferably has a function of fully transferring charges from the charge holding unit 110 to the output unit 112. These functions can be realized by suitably setting a potential distribution of each element forming a pixel circuit. With a configuration that can fully transfer or alternatively reset all the charges, it is possible to suppress transfer unevenness, a reset unevenness, or the like that may be caused by heat. Since this suppresses an influence of thermal noise, a good quality image can be acquired even with a short exposure time period as with the standby exposure, for example.

The imaging system according to the present embodiment can be realized by only adding a simple circuit configuration to a general imaging system, and it is possible to avoid constraint of the number of pixels due to an increase of the pixel size or avoid a reduction in performance such as a reduction of the opening ratio due to a circuit other than the photoelectric conversion unit. Further, the interface of a system on the post-stage that processes data read out from the imaging device can be supported by the same number of signal wirings, the same image processing memory, or the like as that for normal continuous image output. Thereby, it is possible to provide an inexpensive, compact imaging device and an inexpensive, compact imaging system while having the feature of preventing missing of an occurrence event to be captured.

As described above, according to the present embodiment, it is possible to acquire an image at a timing to be captured in response to a trigger signal while suppressing the device configuration from being complex.

Second Embodiment

An imaging system according to a second embodiment of the present invention will be described with reference to FIG. 10 to FIG. 12. The same components as those of the imaging system according to the first embodiment are labeled with the same reference, and the description thereof will be omitted or simplified.

First, the structure of the imaging system according to the present embodiment will be described by using FIG. 10 and FIG. 11. FIG. 10 is a block diagram illustrating a general configuration of the imaging system according to the present embodiment. FIG. 11 is a circuit diagram illustrating a configuration example of pixels of an imaging device in the imaging system according to the present embodiment.

Figure 10:
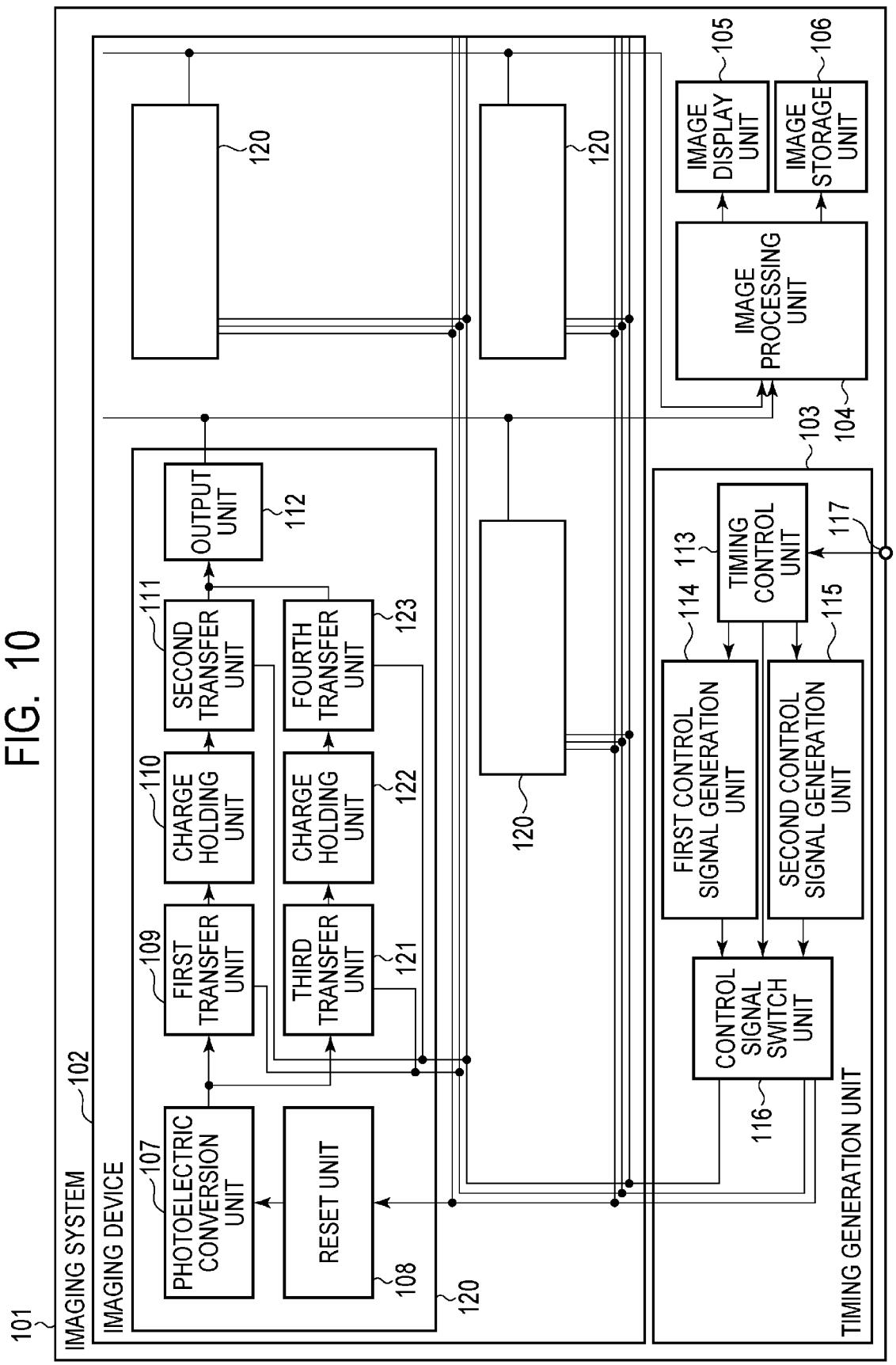
FIG. 10 is a block diagram illustrating a general configuration of an imaging system according to a second embodiment of the present invention.

As illustrated in FIG. 10, the imaging system 101 according to the present embodiment is the same as the imaging system according to the first embodiment except that the configuration of the pixel 120 of the imaging device 102 is different. That is, the pixel 120 of the imaging device 102 in the imaging system 101 of the present embodiment further includes a third transfer unit 121, a charge holding unit 122, and a fourth transfer unit 123 in addition to the configuration of the first embodiment. The third transfer unit 121 includes a function of transferring charges generated and accumulated in the photoelectric conversion unit 107 to the charge holding unit 122. The charge holding unit 122 has a function of temporarily holding charges transferred from the photoelectric conversion unit 107. The fourth transfer unit 123 has a function of transferring charges held in the charge holding unit 122 to the output unit 112. The output unit 112 further has a function of outputting, to the image processing unit 104, a signal (pixel signal) in accordance with the amount of charges transferred from the charge holding unit 122.

That is, the pixel 120 of the imaging device 102 in the imaging system 101 of the present embodiment includes the two charge holding units 110 and 122 used for temporarily storing charges transferred from the photoelectric conversion unit 107. Charge transfer from the photoelectric conversion unit 107 to the charge holding unit 110 and charge transfer from the photoelectric conversion unit 107 to the charge holding unit 122 can be controlled separately by the first transfer unit 109 and the third transfer unit 121. Further, charge transfer from the charge holding unit 110 to the output unit 112 and charge transfer from the charge holding unit 122 to the output unit 112 can be controlled separately by the second transfer unit 111 and the fourth transfer unit 123.

Figure 11:
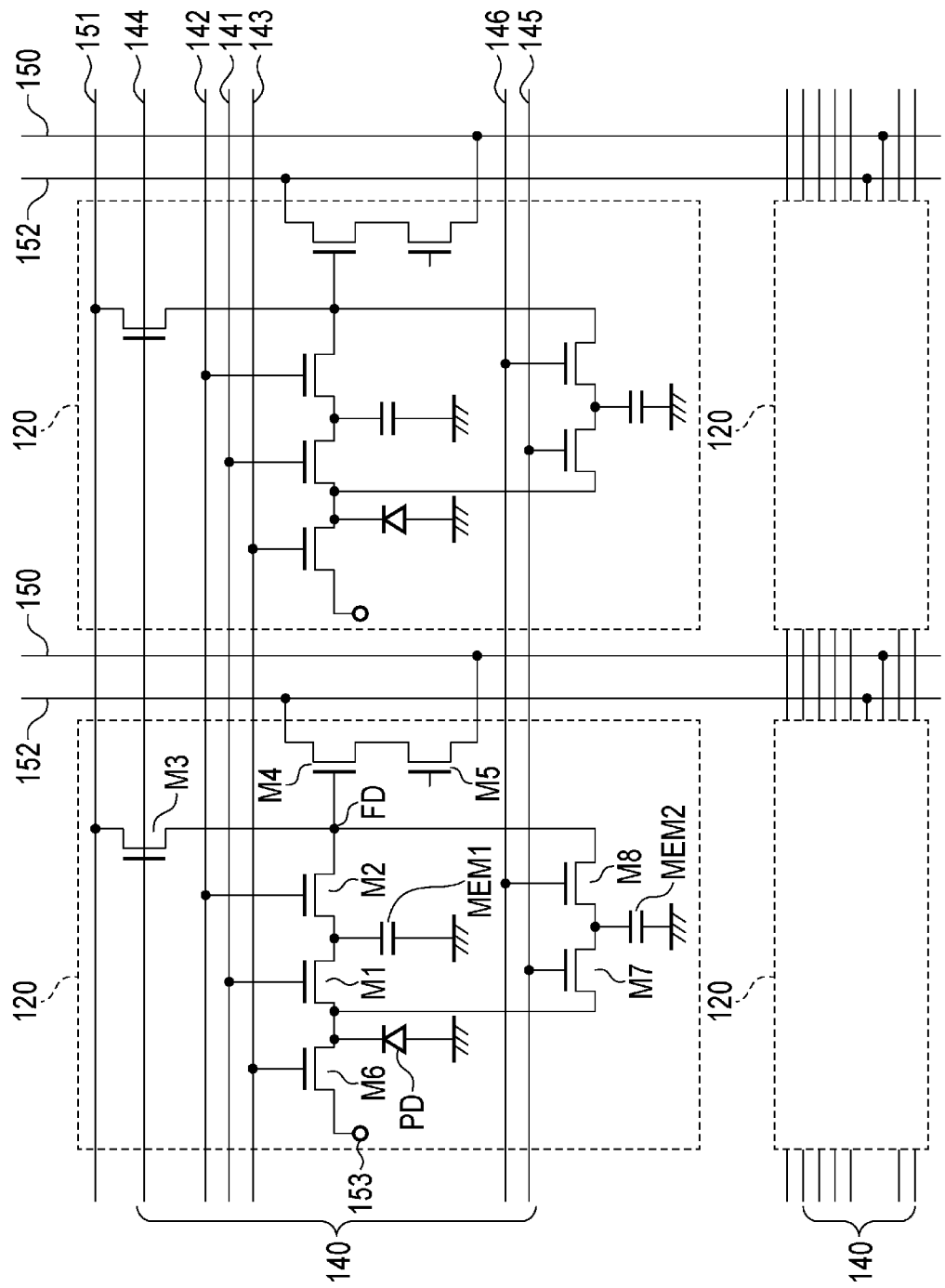
FIG. 11 is a circuit diagram illustrating a configuration example of pixels of an imaging device in the imaging system according to the second embodiment of the present invention.

FIG. 11 illustrates a configuration example of four pixels 120 arranged in a matrix of two rows by two columns. As illustrated in FIG. 11, each of the pixels 120 is formed of the photoelectric conversion element PD, transfer transistors M1, M2, M7, and M8, charge holding portions MEM1 and MEM2, the reset transistor M3, the amplifier transistor M4, the select transistor M5, and the drain transistor M6. The photoelectric conversion element PD corresponds to the photoelectric conversion unit 107 of FIG. 10. The transfer transistor M1 corresponds to the first transfer unit 109 of FIG. 10. The charge holding portion MEM1 corresponds to the charge holding unit 110 of FIG. 10. The transfer transistor M2 corresponds to the second transfer unit 111 of FIG. 10. The transfer transistor M7 corresponds to the third transfer unit 121 of FIG. 10. The charge holding portion MEM2 corresponds to the charge holding unit 122 of FIG. 10. The transfer transistor M8 corresponds to the fourth transfer unit 123 of FIG. 10. The reset transistor M3, the amplifier transistor M4, and the select transistor M5 correspond to the output unit 112 of FIG. 10. The drain transistor M6 corresponds to the reset unit 108 of FIG. 10.

The cathode of a photodiode forming the photoelectric conversion element PD is connected to the source of the transfer transistor M1, the source of the transfer transistor M7, and the source of the drain transistor M6. The drain of the transfer transistor M1 is connected to the source of the transfer transistor M2. The connection node of the drain of the transfer transistor M1 and the source of the transfer transistor M2 includes a capacitance component and has a function of the charge holding portion MEM1. In FIG. 11, this capacitance component is represented as a capacitance element, one terminal of which is connected to the node. The other terminal of this capacitance element is connected to the ground node. The drain of the transfer transistor M7 is connected to the source of the transfer transistor M8. The connection node of the drain of the transfer transistor M7 and the source of the transfer transistor M8 includes a capacitance component and has a function of the charge holding portion MEM2. In FIG. 11, this capacitance component is represented as a capacitance element, one terminal of which is connected to the node. The other terminal of this capacitance element is connected to the ground node.

The drain of the transfer transistor M2 and the drain of the transfer transistor M8 are connected to the source of the reset transistor M3 and the gate of the amplifier transistor M4. The connection node of the drain of the transfer transistor m2, the drain of the transfer transistor M8, the source of the reset transistor M3, and the gate of the amplifier transistor M4 is a so-called a floating diffusion portion FD. The floating diffusion portion FD includes a capacitance component (floating diffusion capacitance) and has a function as a holding portion of charges. The source of the amplifier transistor M4 is connected to the drain of the select transistor M5. The source of the select transistor M5 is connected to the output line 150 on the corresponding column.

On each row of the pixel array, the control lines 140 that supply control signals used for driving the pixels 120 belonging to the corresponding rows are arranged. Each of the control lines 140 includes signal lines 141, 142, 143, 144, 145, and 146. The signal lines 141, 142, 143, and 144 are the same as those of the first embodiment. The signal line 145 is connected to the gates of the transfer transistors M7 of the pixels 120 belonging to the corresponding row. A control signal $\phi GS2$ that includes drive pulses for controlling the transfer transistor M7 is output to the signal line 145. The signal line 146 is connected to the gates of the transfer transistors M8 of the pixels 120 belonging to the corresponding row. A control signal $\phi TX2$ that includes drive pulses for controlling the transfer transistor M8 is output to the signal line 146.

With such a configuration of the pixel 120, it is possible to perform a reset operation in the photoelectric conversion element PD and start accumulation of charges while holding charges transferred from the photoelectric conversion element PD in one of the charge holding portions MEM1 and MEM2. Further, in the other of the charge holding portions MEM1 and MEM2, it is possible to perform a reset operation and provide for transfer of charges from the photoelectric conversion element PD.

That is, in the imaging device 102 of the present embodiment, a reset operation of one of the charge holding portions MEM1 and MEM2 can be performed during a charge holding period of the other. Thereby, it is possible to prevent a charge holding period at the charge holding portion MEM in one frame period from being shorter due to a need for a reset operation and realize a more efficient, simpler standby exposure operation than the case of the first embodiment.

Specifically, while charges are held on a frame basis alternatingly in the two charge holding portions MEM1 and MEM2, a signal resulted before a trigger signal is input is read out from one of the charge holding portions MEM1 and MEM2 which holds charges at a timing when the trigger signal is input. Charges generated by the photoelectric conversion element PD at the timing when the trigger signal is input are transferred to the other of the charge holding portions MEM1 and MEM2 after the exposure period has elapsed and read out as a signal occurring when the trigger signal is input subsequent to readout of a signal occurring before the trigger signal is input.

Next, the operation of the imaging system according to the present embodiment will be described by using FIG. 12. FIG. 12 is a timing chart illustrating the operation of the imaging system according to the present embodiment. FIG. 12 illustrates the standby mode flag, the trigger signal, the control signals $\phi OFD$, $\phi GS1$, $\phi GS2$, $\phi RES$, $\phi TX1(1)$ to $\phi TX1(m)$, and $\phi TX2(1)$ to $\phi TX2(m)$. Note that the control signal $\phi TX1(1)$ is the control signal $\phi TX1$ supplied to the pixels 120 on the first row, and the control signal $\phi TX1(2)$ is the control signal $\phi TX1$ supplied to the pixels 120 on the second row. Further, the control signal $\phi TX1(m)$ is the control signal $\phi TX1$ supplied to the pixels 120 on the m-th row. Similarly, the control signal $\phi TX2(1)$ is the control signal $\phi TX2$ supplied to the pixels 120 on the first row, and the control signal $\phi TX2(2)$ is the control signal $\phi TX2$ supplied to the pixels 120 on the second row. Further, the control signal $\phi TX2(m)$ is the control signal $\phi TX2$ supplied to the pixels 120 on the m-th row.

Figure 12:
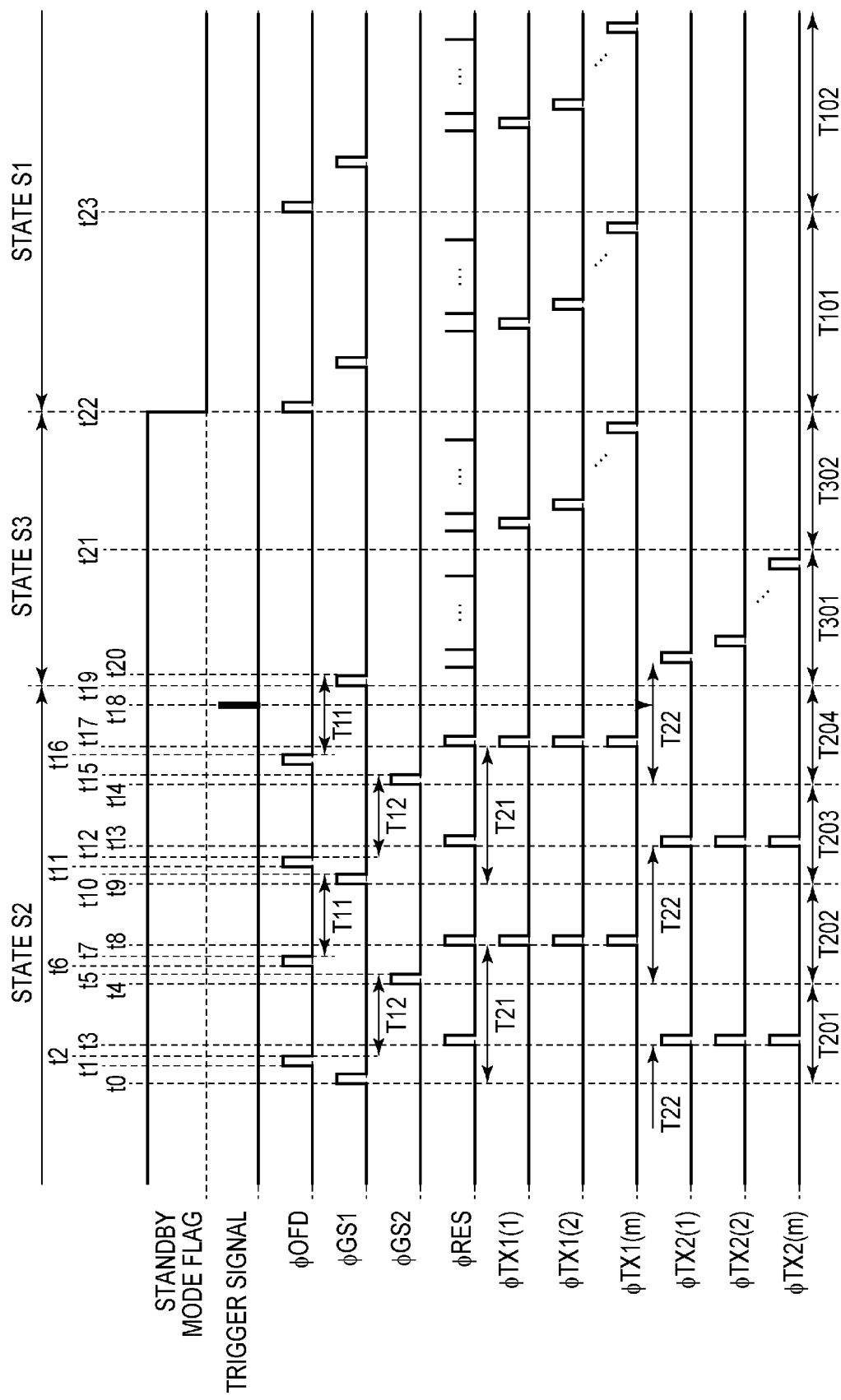
FIG. 12 is a timing chart illustrating a method of driving the imaging system according to the second embodiment of the present invention.

FIG. 12 illustrates one example of the operation from the state S2 to the state S1 via the state S3. In FIG. 12, the period from the time t0 to the time t19 is a period of the state S2, the period from the time t19 to the time t22 is a period of the state S3, and the period on and after the time t22 is a period of the state S1.

In the state S2, a unit period in which a sampling operation to the charge holding portion MEM1 and a reset operation of the charge holding portion MEM2 are performed and a unit period in which a sampling operation to the charge holding portion MEM2 are performed and a reset operation of the charge holding portion MEM1 are alternatingly performed. In FIG. 12, the unit period T201 and the unit period T203 correspond to a unit period in which a sampling operation to the charge holding portion MEM1 and a reset operation of the charge holding portion MEM2 are performed. Further, the unit period T202 and the unit period T204 correspond to a unit period in which a sampling operation to the charge holding portion MEM2 and a reset operation of the charge holding portion MEM1 are performed.

At the time t1, the control signal $\phi OFD$ transitions to a high level, and the photoelectric conversion elements PD of the pixels 120 belonging to all the rows are reset. The time t2 when the control signal $\phi OFD$ transitions to a low level is the start time of an exposure period of the photoelectric conversion elements PD.

Next, at the time t3, the control signals $\phi RES$ and $\phi TX2$ ($\phi TX2(1)$, $\phi TX2(2)$, . . . , $\phi TX2(m)$) transition to a high level, and the charge holding portions MEM2 of the pixels 120 belonging to all the rows are reset.

Next, at the time t4, the control signal $\phi GS2$ transitions to a high level, and charges accumulated in the photoelectric conversion element PD are transferred to the charge holding portion MEM2 in the pixels 120 belonging to all the rows. The period T12 from the time t2 to the time t5 when the control signal $\phi GS2$ transitions to a low level corresponds to an exposure period in which charges to be transferred from the photoelectric conversion element PD to the charge holding portion MEM2 are generated.

Next, at the time t6, the control signal ϕOFD transitions to a high level, and the photoelectric conversion elements PD of the pixels 120 belonging to all the rows are reset. The time t7 when the control signal ϕOFD transitions to a low level is the start time of an exposure period of the photoelectric conversion element PD.

Next, at the time t8, the control signals ϕRES and ϕTX1 (ϕTX1(1), ϕTX1(2), . . . , ϕTX1(m)) transition to a high level, and the charge holding portions MEM1 of the pixels 120 belonging to all the rows are reset. The period T21 from the time t0 to the time t8 is a period in which the charge holding portion MEM1 accumulates charges.

Next, at the time t9, the control signal ϕGS1 transitions to a high level, and charges accumulated in the photoelectric conversion element PD are transferred to the charge holding portion MEM1 in the pixels 120 belonging to all the rows. The period T11 from the time t7 to the time t10 when the control signal ϕGS1 transitions to a low level corresponds to an exposure period in which charges to be transferred from the photoelectric conversion element PD to the charge holding portion MEM1 are generated.

Next, at the time t11, the control signal ϕOFD transitions to a high level, and the photoelectric conversion elements PD of the pixels 120 belonging to all the rows are reset. The time t12 when the control signal ϕOFD transitions to a low level is the start time of an exposure period of the photoelectric conversion element PD.

Next, at the time t13, the control signals ϕRES and ϕTX2 transition to a high level, and the charge holding portions MEM2 of the pixels 120 belonging to all the rows are reset. The period T22 from the time t4 to the time t13 is a period in which the charge holding portion MEM2 accumulates charges.

Similarly, charges accumulated in the photoelectric conversion element PD on and after the time t12 are transferred to the charge holding portion MEM2 during a period to the time t15, and charges accumulated in the photoelectric conversion element PD on and after the time t16 are transferred to the charge holding portion MEM1 during a period to the time t20.

In such a way, in the state S2, a unit period in which a sampling operation to the charge holding portion MEM1 and a reset operation of the charge holding portion MEM2 are performed and a unit period in which a sampling operation to the charge holding portion MEM2 and a reset operation of the charge holding portion MEM1 are performed are alternatingly performed.

Transition from the state S2 to the state S3 is performed in response to detection of input of a trigger signal. FIG. 12 illustrates an operation example when a trigger signal is input at the time t18 in the unit period T204. Here, at the time t18 when the trigger signal is input, it is assumed that charge holding portion MEM2 has already held charges and, in the photoelectric conversion element PD, an exposure period for generating charges to be transferred to the charge holding portion MEM1 has already been performed.

In the state S3, in the unit period T301, readout of a signal based on charges held by the charge holding portion MEM1 or the charge holding portion MEM2 at the time of input of the trigger signal is performed. Further, in the subsequent unit period T302, a signal based on charges transferred to the charge holding portion MEM2 or the charge holding portion MEM1 after the end of an exposure operation which has been performed in the photoelectric conversion element PD at the time of input of the trigger signal is read out.

In the example of FIG. 12, at the time t18, charges generated during an exposure period immediately before the trigger signal is input (period T12) are held in the charge holding portion MEM2. Further, in the photoelectric conversion element PD, an exposure period in which charges to be next transferred to the charge holding portion MEM1 are generated (period T11) is implemented. Therefore, when the imaging device 102 transitions from the state S2 to the state S3 in response to input of the trigger signal at the time t18, in the unit period T301, readout of a signal based on charges held in the charge holding portion MEM2 is performed on a row basis during the unit period T204. Further, in the unit period T302, readout of a signal based on charges generated by the photoelectric conversion element PD and transferred to the charge holding portion MEM1 during the unit period T204 is performed on a row basis.

Specifically, the control signals ϕTX2 and ϕRES are supplied to the second transfer unit 111 and the output unit 112 of the pixel 120 from the second control signal generation unit 115 via the control signal switch unit 116 at a predetermined timing. Thereby, reset of the floating diffusion portion FD and transfer of charges from the charge holding portion MEM2 to the floating diffusion portion FD are performed sequentially on a row basis, and a pixel signal is read out from each of the pixels 120.

Further, at the time t19, the control signal ϕGS1 is controlled to a high level, and charges accumulated in the photoelectric conversion element PD are transferred to the charge holding portion MEM1. Then, in the unit period T302 on and after the time t21, the control signals ϕTX1 and ϕRES are supplied to the first transfer unit 109 and the output unit 112 of the pixel 120 from the second control signal generation unit 115 via the control signal switch unit 116 at a predetermined timing. Thereby, reset of the floating diffusion portion FD and transfer of charges from the charge holding portion MEM1 to the floating diffusion portion FD are performed sequentially on a row basis, and a pixel signal is read out from each of the pixels 120.

In the state S3, upon the completion of readout of a signal based on charges held in the charge holding portions MEM1 and MEM2 from the pixels 120 belonging to all the rows, the standby mode flag becomes a low level at the time t22, and the state transitions to the normal exposure mode (state S1).

In the state S1, in each of the frame periods defined by the unit periods T101, T102, . . . , an exposure operation of the photoelectric conversion elements PD and a readout operation of signals based on charges generated by the photoelectric conversion elements PD are performed in the same manner as the normal global electronic shutter operation.

Since, unlike in the state S3, the readout operation of pixel signals is performed in the state S1, each length of the unit periods T101 and T102 in which the state S1 is performed is longer than each length of the unit periods T201, T202, T203, and T204 in which the state S2 is performed. Therefore, according to the present embodiment, it is possible to prevent missing of an image at an immediately previous moment that has substantially no time difference with respect to the timing when a trigger signal is input, in a similar manner to the case of the first embodiment.

Further, as described in the present embodiment, with a plurality of charge holding units 110 and 122 being provided separately from the photoelectric conversion unit 107 in the pixel 120, a standby exposure operation can be repeated so as to update one charge holding unit while ensuring one frame image by using the other charge holding unit. This enables both an image occurring immediately before a trigger signal is input and an image occurring at the timing when the trigger signal is input to be read out continuously.

Thereby, an event occurring at a short time before and after input of a trigger signal can be more accurately recognized.

When the imaging system 101 according to the present embodiment is configured, the imaging device 102 is not required to have any special configuration as long as it has a charge holding unit that can perform reset without reading out an image and has a configuration that can change the exposure cycle between the normal exposure and the standby exposure. It is therefore possible to realize an imaging device that can acquire an image immediately before a trigger signal is input while preventing deterioration of image quality due to a reduction in the number of pixels or the opening ratio without significantly affecting the integration density of the imaging device 102.

As described above, according to the present embodiment, it is possible to acquire an image at a timing to be captured in response to a trigger signal while suppressing the device configuration from being complex.

Third Embodiment

Figure 13:
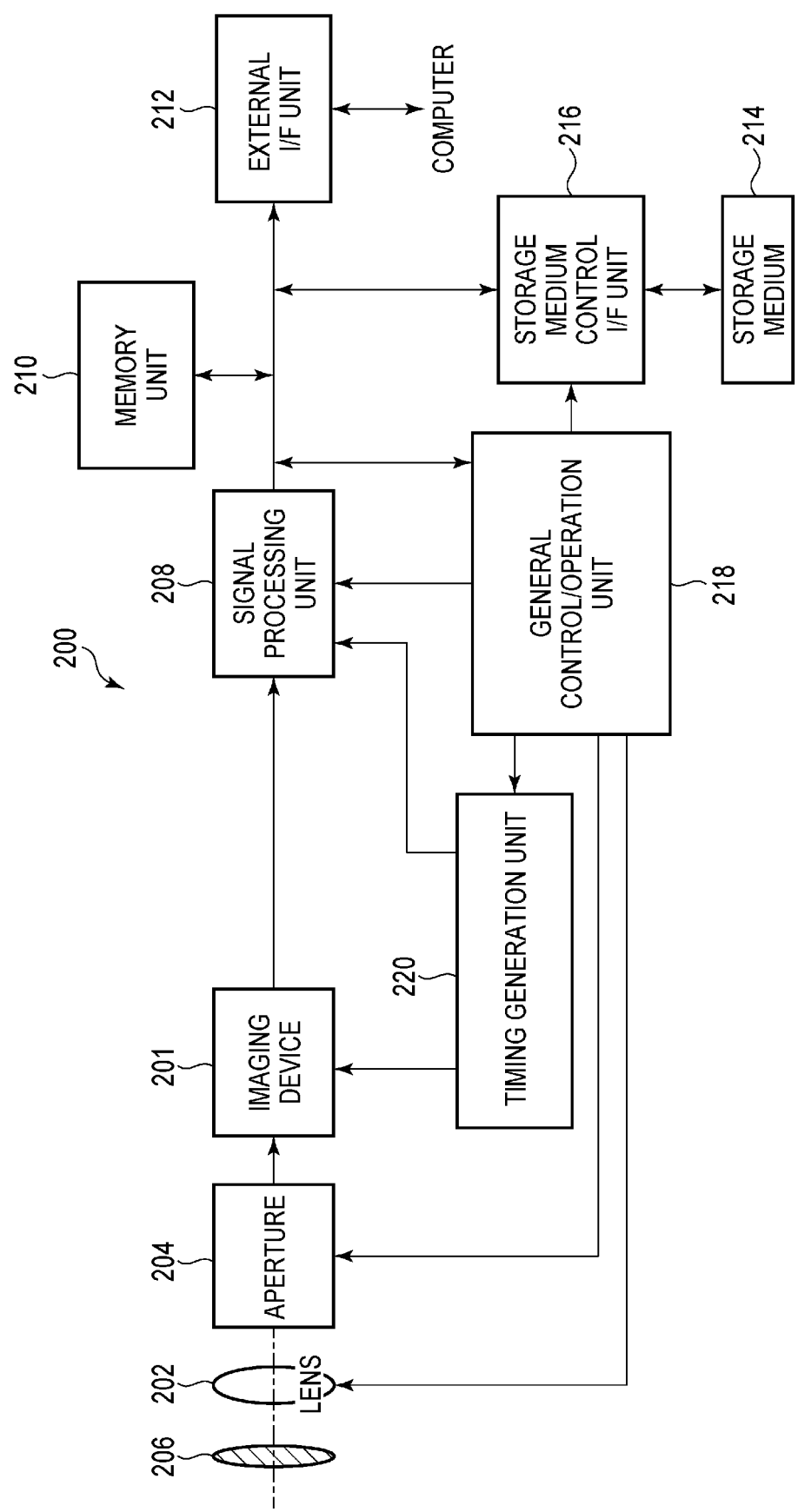
FIG. 13 is a block diagram illustrating a general configuration of an imaging system according to a third embodiment of the present invention.

An imaging system according to a third embodiment of the present invention will be described with reference to FIG. 13. FIG. 13 is a block diagram illustrating a general configuration of the imaging system according to the present embodiment.

The imaging device 102 described in the above first and second embodiments is applicable to various imaging systems. Examples of applicable imaging systems may include a digital still camera, a digital camcorder, a surveillance camera, a copying machine, a fax machine, a mobile phone, an on-vehicle camera, an observation satellite, and the like. In addition, a camera module including an optical system such as a lens and an imaging device is also included in the imaging system. FIG. 13 illustrates a block diagram of a digital still camera as an example out of these examples.

The imaging system 200 illustrated as an example in FIG. 13 has an imaging device 201, a lens 202 that captures an optical image of an object onto the imaging device 201, an aperture 204 for changing a light amount passing through the lens 202, and a barrier 206 for protecting the lens 202. The lens 202 and the aperture 204 form an optical system that converges a light onto the imaging device 201. The imaging device 201 is the imaging device 102 described in any of the first or second embodiment and converts an optical image captured by the lens 202 into image data.

The imaging system 200 further includes a signal processing unit 208 that processes an output signal output from the imaging device 201. The signal processing unit 208 preforms an AD-conversion that converts an analog signal output by the imaging device 201 into a digital signal. In addition, the signal processing unit 208 performs various correction and compression other than above, if necessary, and outputting image data. An AD-conversion unit, which is a part of the signal processing unit 208, may be formed on a semiconductor substrate on which the imaging device 201 is provided or a semiconductor substrate on which the imaging device 201 is not provided. Further, the imaging device 201 and the signal processing unit 208 may be formed on the same semiconductor substrate.

The imaging system 200 further includes a memory unit 210 for temporarily storing image data therein and an external interface unit (external I/F unit) 212 for communicating with an external computer or the like. The imaging system 200 further includes a storage medium 214 such as a semiconductor memory for performing storage or readout of imaging data and a storage medium control interface unit (storage medium control I/F unit) 216 for performing storage or readout on the storage medium 214. Note that the storage medium 214 may be embedded in the imaging system 200 or may be removable.

The imaging system 200 further has a general control/operation unit 218 that controls various operations and the entire digital still camera and a timing generation unit 220 that outputs various timing signals to the imaging device 201 and the signal processing unit 208. The timing generation unit 220 may include the function of the timing generation unit 103 described in the first or second embodiment. Here, the timing signal or the like may be input from the outside, and the imaging system 200 may include at least the imaging device 201 and the signal processing unit 208 that processes an output signal output from the imaging device 201.

The imaging device 201 outputs an imaging signal to the signal processing unit 208. The signal processing unit 208 performs predetermined signal processing on an imaging signal output from the imaging device 201 and outputs image data. The signal processing unit 208 uses an imaging signal to generate an image. The signal processing unit 208 may include the function of the image processing unit 104 described in the first or second embodiment.

As discussed above, according to the present embodiment, the imaging system to which the imaging device 102 according to the first or second embodiment is applied can be realized.

Fourth Embodiment

Figure 14A:
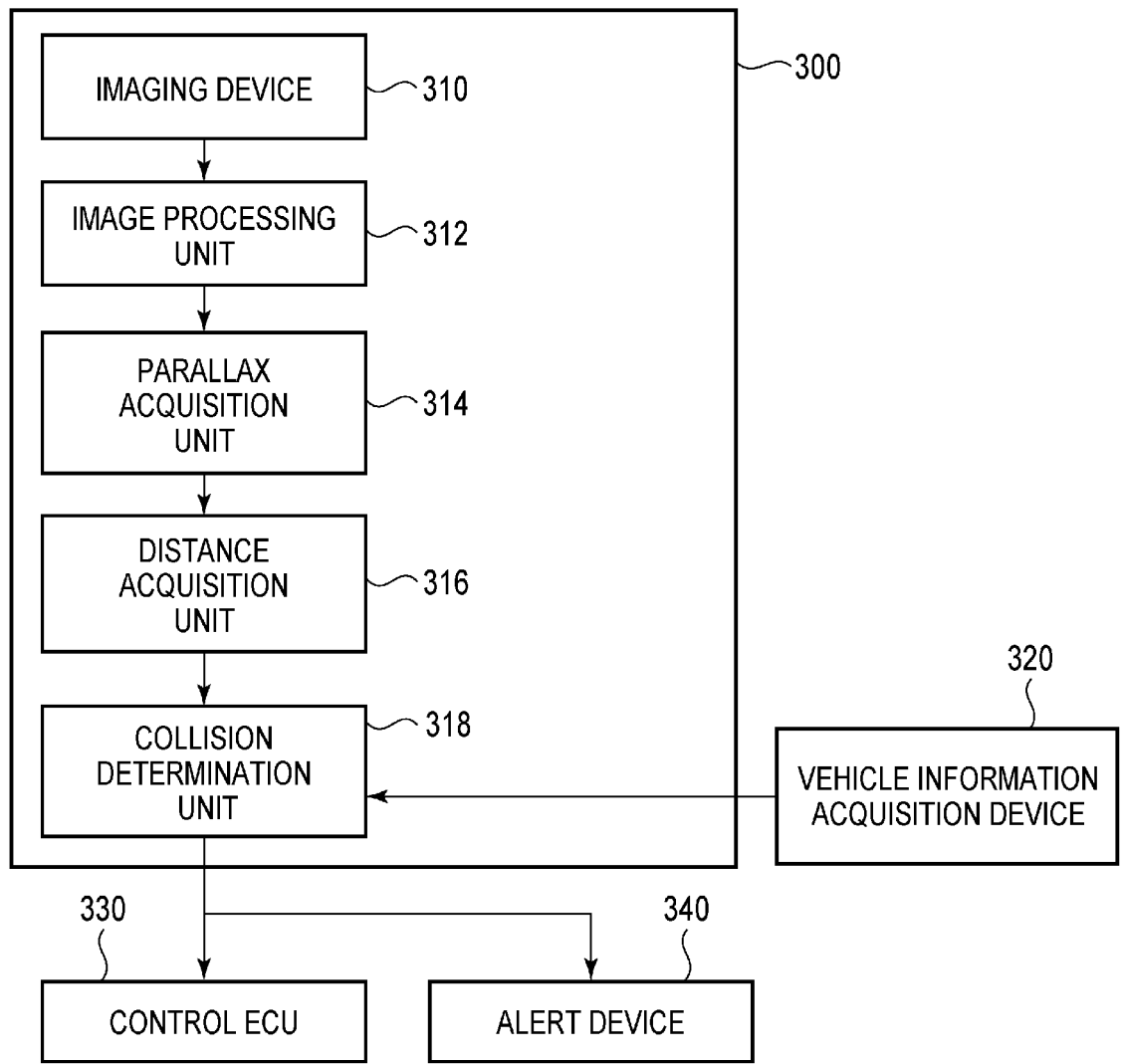
FIG. 14A is a diagram illustrating a configuration example of an imaging system according to a fourth embodiment of the present invention.
Figure 14B:
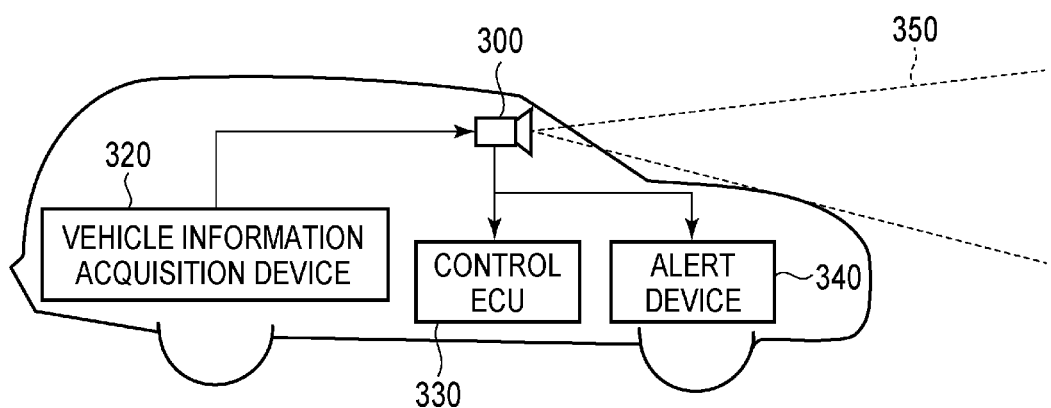
FIG. 14B is a diagram illustrating a configuration example of a movable object according to the fourth embodiment of the present invention.

An imaging system and a movable object according to a fourth embodiment of the present invention will be described with reference to FIG. 14A and FIG. 14B. FIG. 14A is a diagram illustrating a configuration of an imaging system according to the present embodiment. FIG. 14B is a diagram illustrating a configuration of a movable object according to the present embodiment.

FIG. 14A illustrates an example of an imaging system related to an on-vehicle camera. The imaging system 300 has an imaging device 310. The imaging device 310 is the imaging device 102 described in any of the above first and second embodiments. The imaging system 300 has an image processing unit 312 that performs image processing on a plurality of image data acquired by the imaging device 310 and a parallax acquisition unit 314 that calculates a parallax (a phase difference of parallax images) from the plurality of image data acquired by the imaging system 300. Further, the imaging system 300 has a distance acquisition unit 316 that calculates a distance to the object based on the calculated parallax and a collision determination unit 318 that determines whether or not there is a collision possibility based on the calculated distance. Here, the parallax acquisition unit 314 and the distance acquisition unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like, or may be implemented by combination thereof.

The imaging system 300 is connected to the vehicle information acquisition device 320 and can acquire vehicle information such as a vehicle speed, a yaw rate, a steering angle, or the like. Further, the imaging system 300 is connected to a control ECU 330, which is a control device that outputs a control signal for causing a vehicle to generate braking force based on a determination result by the collision determination unit 318. Further, the imaging system 300 is also connected to an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 14B illustrates the imaging system when a front area of a vehicle (a capturing area 350) is captured. The vehicle information acquisition device 320 transmits an instruction to the imaging system 300 or the imaging device 310. Such a configuration can further improve the ranging accuracy.

Although the example of control for avoiding a collision to another vehicle has been described, the embodiment is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is one of the embodiments of the present invention.

Further, a configuration one pixel 120 has one charge holding portion MEM has been illustrated in the first embodiment described above, and a configuration one pixel 120 has two charge holding portions MEM1 and MEM2 has been illustrated in the second embodiment described above. However, the number of charge holding portions MEM provided in one pixel 120 is not limited thereto, and one pixel 120 may include three or more, multiple charge holding portions. In such a case, by sequentially sampling charges to the multiple charge holding portions in the standby mode, it is possible to acquire a plurality of images occurring immediately before the timing when a trigger signal is input.

Further, while the imaging device 102 having the pixel 120 including the drain transistor M6 has been described as an example in the above first and second embodiments, the pixel 120 is not necessarily required to include the drain transistor M6. In such a case, after transfer of charges from the photoelectric conversion element to the charge holding portion, the timing when the control signal φGS1 is controlled to a low level is the start time of an exposure period.

Further, the imaging systems illustrated in the above third and fourth embodiments are examples of an imaging system to which the photoelectric conversion device of the present invention may be applied, and an imaging system to which the imaging device of the present invention can be applied is not limited to the configuration illustrated in FIG. 13 and FIG. 14A.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-095043, filed May 17, 2018 which is hereby incorporated by reference herein in its entirety.

What is claimed is:

1. An imaging device comprising:
a plurality of pixels each including a photoelectric conversion unit that generates charges by photoelectric conversion, a charge holding unit that holds charges transferred from the photoelectric conversion unit, and an output unit that outputs a signal in accordance with an amount of charges held by the charge holding unit; and
a control unit that performs a first control, which causes the plurality of pixels to perform an operation that includes an exposure operation of the photoelectric conversion unit, a reset operation of the charge holding unit, and a charge transfer operation from the photoelectric conversion unit to the charge holding unit and updates charges held by the charge holding unit by using the reset operation and the charge transfer operation, and a second control to read out a signal based on charges held by the charge holding unit from each of the plurality of pixels,
wherein the control unit repeats the first control at a predetermined cycle without inserting the second control in a first period before a trigger signal is externally input, and
wherein the control unit changes the first control to the second control when the trigger signal is externally input after the first period.

2. The imaging device according to claim 1, wherein when the charge holding unit holds charges transferred from the photoelectric conversion unit at a timing when the trigger signal is received, the output unit outputs a signal in accordance with an amount of charges including at least charges generated in the photoelectric conversion unit until the timing, held by the charge holding unit.

3. The imaging device according to claim 1, wherein when a period of the exposure operation is shorter than a predetermined length at a timing when the trigger signal is received, the output unit outputs a signal in accordance with an amount of charges held by the charge holding unit after completion of the exposure operation and the charge transfer operation that are ongoing.

4. The imaging device according to claim 3, wherein when a period of the exposure operation is longer than a predetermined length at a timing when the trigger signal is received, the output unit outputs a signal in accordance with an amount of charges including at least charges generated in the photoelectric conversion unit until the timing, held by the charge holding unit.

5. The imaging device according to claim 1,
wherein the charge holding unit of each of the plurality of pixels has a first charge holding portion and a second charge holding portion, and
wherein charges held by the first charge holding unit and charges held by the second charge holding unit are updated alternatingly at the predetermined cycle in the first control.

6. The imaging device according to claim 5, wherein the output unit outputs a signal in accordance with an amount of charges held by the first charge holding unit at a timing when the trigger signal is received, and after completion of the exposure operation and the charge transfer operation that are ongoing in the second charge holding unit at the timing when the trigger signal is received, outputs a signal in accordance with an amount of charges held by the second charge holding unit.

7. The imaging device according to claim 1, wherein each of the plurality of pixels further has a reset unit that resets the photoelectric conversion unit.

8. The imaging device according to claim 1, wherein the output unit further has a third charge holding unit that holds charges transferred from the charge holding unit, and the output unit outputs a signal in accordance with an amount of charges held by the third charge holding unit.

9. The imaging device according to claim 1,
wherein the plurality of pixels are arranged in a plurality of rows and a plurality of columns, and
wherein the exposure operation and the charge transfer operation are performed at the same time for pixels on the plurality of rows, and a readout operation to output a signal in accordance with an amount of charges held by the charge holding unit is performed for each row of the plurality of rows.

10. The imaging device according to claim 1 further comprising:
a first control signal generation unit that generates a first control signal used for performing the first control to the plurality of pixels;
a second control signal generation unit that generates a second control signal used for performing the second control to the plurality of pixels; and
a trigger signal receive unit that receives the trigger signal.

11. A movable object comprising:
the imaging device according to claim 1;
a distance information acquisition unit that acquires distance information on a distance to an object, from a parallax image based on signals output from the imaging device; and
a control unit that controls the movable object based on the distance information.

12. An imaging system comprising:
the imaging device according to claim 1;
a first control signal generation unit that generates a first control signal used for performing the first control to the plurality of pixels and supplies the first control signal to the imaging device; and
a second control signal generation unit that generates a second control signal used for performing the second control to the plurality of pixels and supplies the second control signal to the imaging device.

13. The imaging system according to claim 12 further comprising:
a trigger signal receive unit that receives the trigger signal; and
a control signal switch unit that, in response to receiving the trigger signal, switches a control signal to be supplied to the imaging device from the first control signal to the second control signal.

14. The imaging system according to claim 12 further comprising: a signal processing unit that processes a signal output from the imaging device.

15. An imaging system comprising:
an imaging device including a plurality of pixels each including a photoelectric conversion unit that generates charges by photoelectric conversion, a charge holding unit that holds charges transferred from the photoelectric conversion unit, and an output unit that outputs a signal in accordance with an amount of charges held by the charge holding unit;
a first control signal generation unit that generates a first control signal used for operating the imaging device in a first operation mode that includes an exposure operation of the photoelectric conversion unit, a reset operation of the charge holding unit, and a charge transfer operation from the photoelectric conversion unit to the charge holding unit and updates charges held by the charge holding unit by using the reset operation and the charge transfer operation;
a second control signal generation unit that generates a second control signal used for operating the imaging device in a second operation mode that reads out a signal based on charges held by the charge holding unit from each of the plurality of pixels; and
a control unit that controls the first control signal generation unit and the second control signal generation unit,
wherein the control unit repeats the first operation mode at a predetermined cycle without inserting the second operation mode in a first period before a trigger signal is externally input, and
wherein the control unit changes the first operation mode to the second operation mode when the trigger signal is externally input after the first period.

16. The imaging system according to claim 15 further comprising:
a trigger signal receive unit that receives the trigger signal; and
a control signal switch unit that, in response to receiving the trigger signal, switches a control signal to be supplied to the imaging device from the first control signal to the second control signal.

17. The imaging system according to claim 15 further comprising: a signal processing unit that processes a signal output from the imaging device.

18. A method of driving an imaging device including a plurality of pixels each including a photoelectric conversion unit that generates charges by photoelectric conversion, a charge holding unit that holds charges transferred from the photoelectric conversion unit, and an output unit that outputs a signal in accordance with an amount of charges held by the charge holding unit, the method comprising:
causing the plurality of pixels to perform an operation that includes an exposure operation of the photoelectric conversion unit, a reset operation of the charge holding unit, and a charge transfer operation from the photoelectric conversion unit to the charge holding unit and updates charges held by the charge holding unit by using the reset operation and the charge transfer operation; and reading out a signal based on charges held by the charge holding unit from each of the plurality of pixels, wherein the causing to perform the operation is repeated at a predetermined cycle without inserting the reading out the signal in a first period before a trigger signal is externally input, and wherein the causing to perform the operation is changed to the reading out the signal when the trigger signal is externally input after the first period.

* * * * *